(12) United States Patent
Massoubre et al.

(10) Patent No.: US 10,840,418 B1
(45) Date of Patent: Nov. 17, 2020

(54) FABRICATING PARABOLIC-SHAPED LEDS

(71) Applicant: Facebook Technologies, LLC, Menlo Park, CA (US)

(72) Inventors: David Massoubre, Cork (IE); Daniel Brodoceanu, Cork (IE); Oscar Torrents Abad, Cork (IE); Vaishali Chopra, Saarland (DE)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 16/424,325

(22) Filed: May 28, 2019

(51) Int. Cl.
  *H01L 33/58* (2010.01)
  *G02B 27/01* (2006.01)
  *G03F 7/20* (2006.01)
(52) U.S. Cl.
  CPC .......... *H01L 33/58* (2013.01); *G02B 27/0172* (2013.01); *G03F 7/7005* (2013.01); *G02B 2027/0178* (2013.01); *H01L 2933/0058* (2013.01)
(58) Field of Classification Search
  CPC .... H01L 33/58; G02B 27/0172; G03F 7/7005
  See application file for complete search history.

(56) References Cited

U.S. PATENT DOCUMENTS

| | | | |
|---|---|---|---|
| 2015/0378162 A1* | 12/2015 | Bailey | G02B 27/0176 345/8 |
| 2019/0013438 A1* | 1/2019 | Brennan | H01L 33/06 |

\* cited by examiner

*Primary Examiner* — Andrew Q Tran
(74) *Attorney, Agent, or Firm* — Shook, Hardy & Bacon L.L.P.

(57) ABSTRACT

Systems and methods for fabricating parabolic LEDs are provided. The parabolic shape of the LEDs is precisely-controlled and highly-uniform across a substrate. By precisely controlling the shape, and providing a high-uniformity across the substrate, the luminance and process yield of the LEDs is enhanced. The precise-control and high-uniformity of the shape is enabled via a precisely-shaped and highly-uniform mask formed on the substrate. The ability to precisely-control both the shape and uniformity the mask is achieved by forming the mask utilizing three-dimensional (3D) patterning and/or machining methods. The mask includes a precisely-shaped boss with the same shape as the LED, and a cylindrical protrusion extending beyond the boss. The combination of the boss and cylindrical protrusion allows for the mask to be over-etched, without significantly effecting the shape of the LED. Thus, any non-uniformities etching process do not decrease the luminance, nor uniformity, of the LEDs.

20 Claims, 14 Drawing Sheets

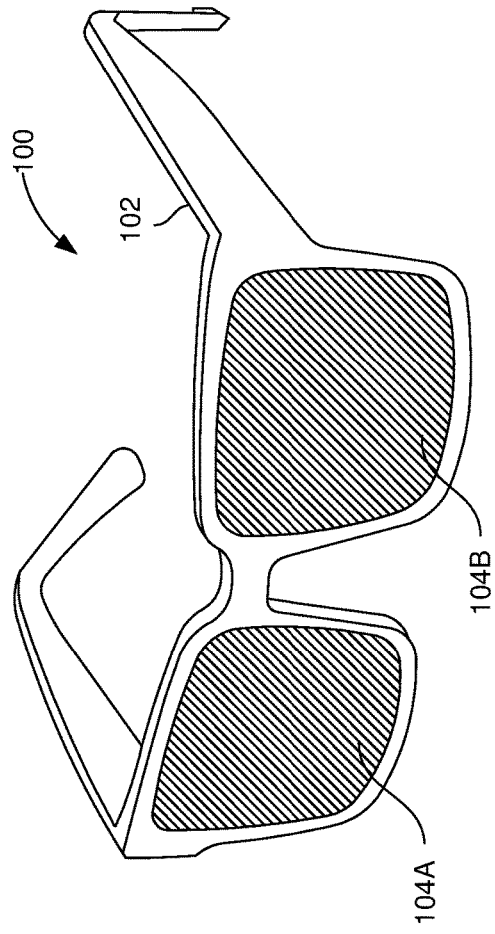
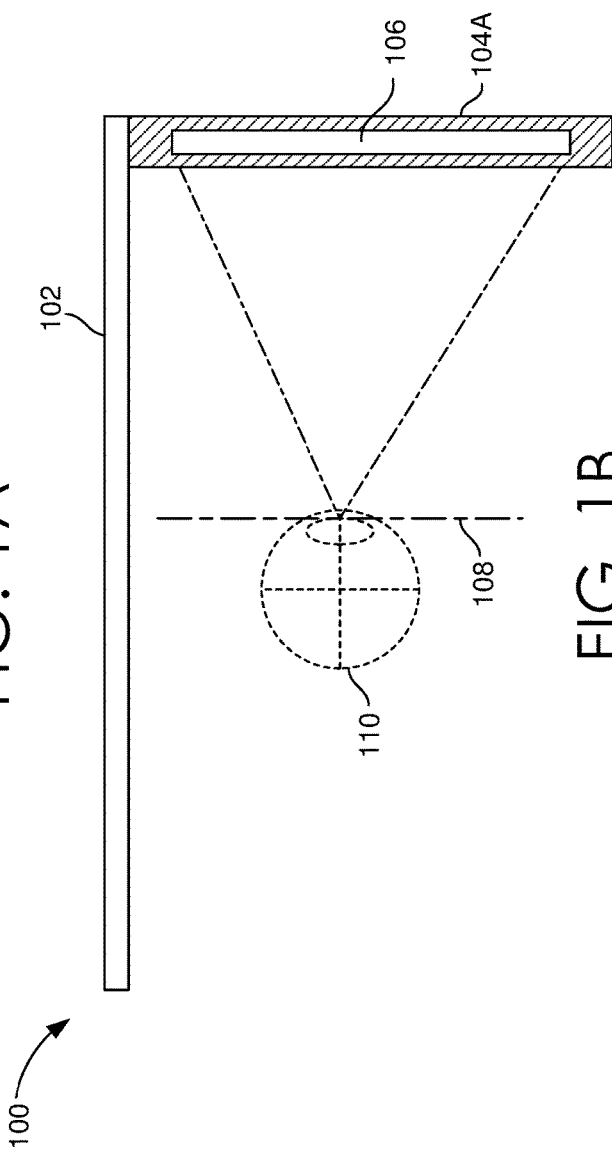

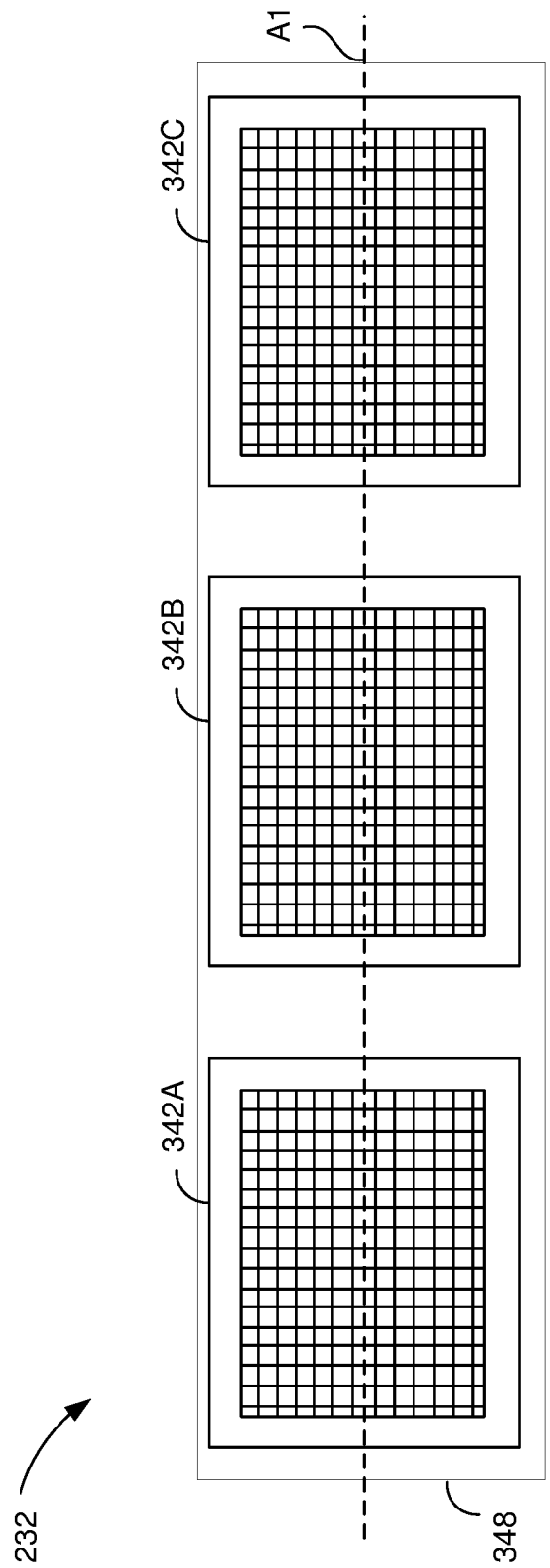

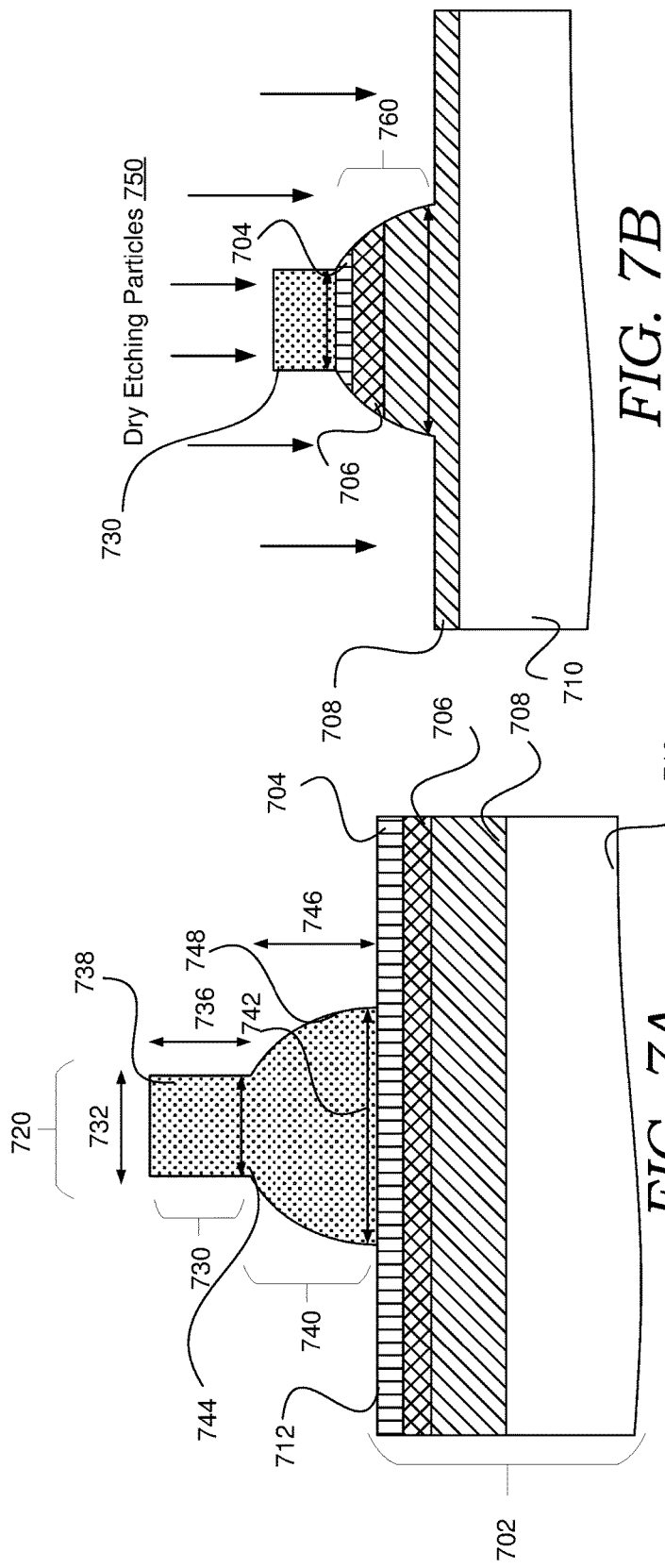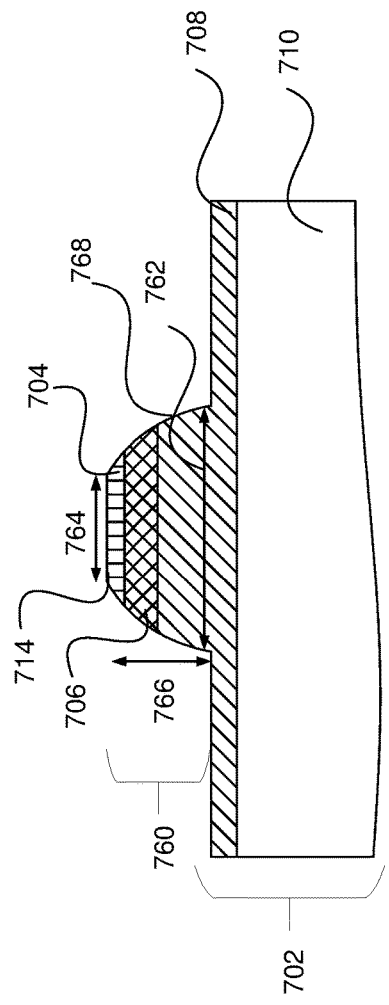

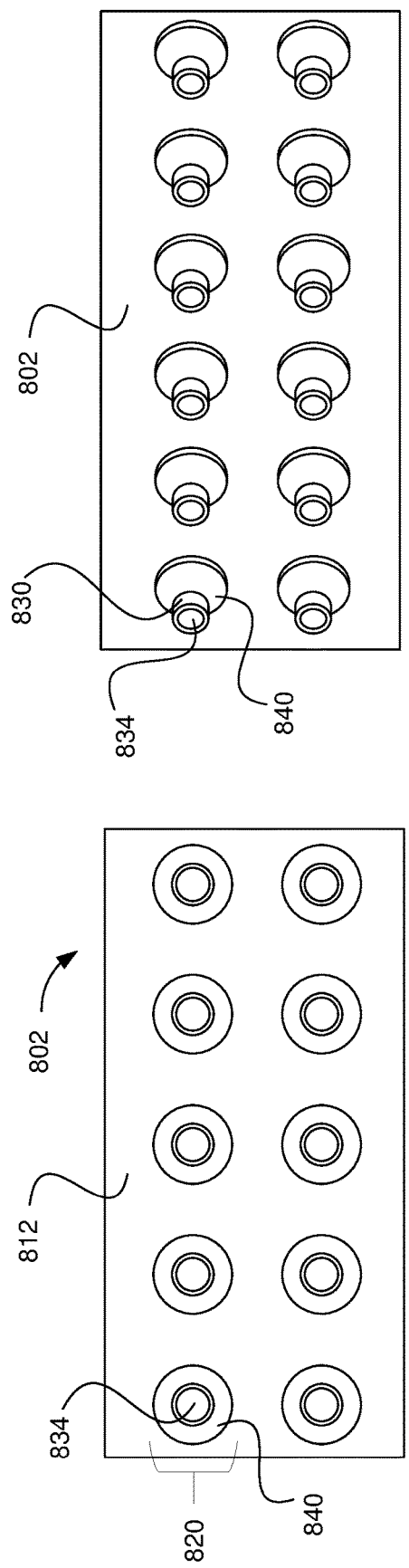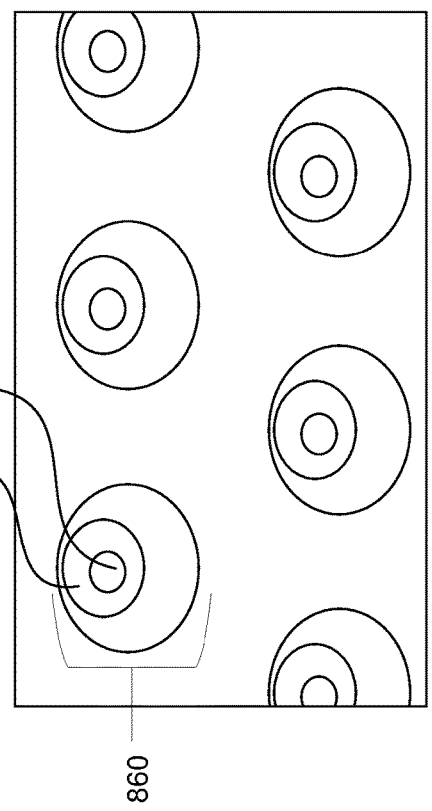
FIG. 8A.
FIG. 8B.
FIG. 8C.

FABRICATING PARABOLIC-SHAPED LEDS

BACKGROUND

The present disclosure relates to the manufacture and assembly of electronic display devices.

Electronic displays are a core component of many computing devices, such as smart phones, tablets, smartwatches, laptops, desktops, televisions (TVs), and head-mounted devices (e.g., virtual reality (VR) devices, augmented reality (AR) devices, and/or mixed-reality (MR) devices). Near-eye displays (NEDs), such as those included in head-mounted devices, benefit from a sufficiently high definition (i.e., a significant pixel density), as well as fast refresh rates and high luminance levels. Because of their small mass and feature size, as well as their low power requirements, light-emitting diodes (LEDs) are a good candidate light source for the pixels in such NEDs.

SUMMARY

Embodiments of the present invention relate to systems and methods for fabricating conic section-shaped semiconductor devices, such as but not limited to light-emitting diodes (LEDs). The shape of the fabricated semiconductor devices is precisely controlled and highly uniform across a fabrication substrate (e.g., a wafer). The precisely controlled shape of the semiconductor devices may include a parabolic solid of revolution. In embodiments where the semiconductor devices include LEDs, by precisely controlling the shape of the parabolic LEDs, and providing a high uniformity across the substrate, the luminance and process yield of the fabricated LEDs is significantly enhanced.

The precise control and high uniformity of the shape of the semiconductor devices is enabled via a precisely shaped and highly uniform mask formed on an upper surface of the substrate. The ability to precisely control both the shape and uniformity of the mask is achieved by forming the mask utilizing three-dimensional (3D) patterning and/or machining methods (e.g., 2-photon lithography, nano-indentation, electron or ion beam lithography, or the like), rather than photoresist reflow techniques. For each semiconductor device, the mask includes a precisely shaped boss (e.g., a mesa that is shaped as a truncated conic section solid of revolution) with the same shape as the semiconductor device to be fabricated and a cylindrical protrusion extending beyond an upper portion of the boss. The combination of the boss and cylindrical protrusion allows for the mask to be over-etched, without significantly effecting the shape of the semiconductor device. Thus, any non-uniformities in the selectivity of the etching process do not decrease the enhanced luminance, nor uniformity, of the LEDs.

In some embodiments, the LED is a micro light-emitting diode (μLEDs). Because the parabolic shape of the μLEDs is precisely controlled and highly uniform, the μLEDs are highly luminous, and thus are an ideal candidate for near-eye displays (NEDs), such as those employed in head-mounted devices (HMDs). Such HMDs that employ these highly luminous μLEDs may include, but are not limited to, virtual reality (VR) devices, augmented reality (AR) devices, and/or mixed-reality (MR) devices.

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

BRIEF DESCRIPTION OF THE DRAWINGS

The present invention is described in detail below with reference to the attached drawing figures, wherein:

FIG. 1A is a diagram of a head-mounted device according to some embodiments;

FIG. 1B illustrates a cross-sectional view of a portion of the head-mounted device of FIG. 1A, in accordance with some embodiments;

FIG. 4 shows a top view of a light source that includes a 1D configuration of emitter arrays, according to some embodiments;

FIG. 7A is a diagram illustrating a mask formed on a top surface of a semiconductor substrate, in accordance with one embodiment;

FIG. 7B is a diagram illustrating an etching process that removes a portion of the mask of FIG. 7A, in accordance with one embodiment.

FIG. 7C is a diagram illustrating a semiconductor device fabricated from the semiconductor substrate of FIGS. 7A-7B, wherein the remaining portion of the mask has been removed via a photoresist-stripping process;

FIG. 8A is a diagram illustrating a top view of a mask, including a plurality of bosses and cylindrical protrusions, formed on a top surface of a semiconductor substrate, to fabricate a plurality of light-emitting diodes, in accordance with one embodiment;

FIG. 8B is a diagram illustrating a tilted view of a mask and semiconductor substrate of FIG. 8A;

FIG. 8C is a diagram illustrating the plurality of light-emitting diodes fabricated from the mask and semiconductor substrate of FIGS. 8A-8B.

DETAILED DESCRIPTION

Figure 2A:
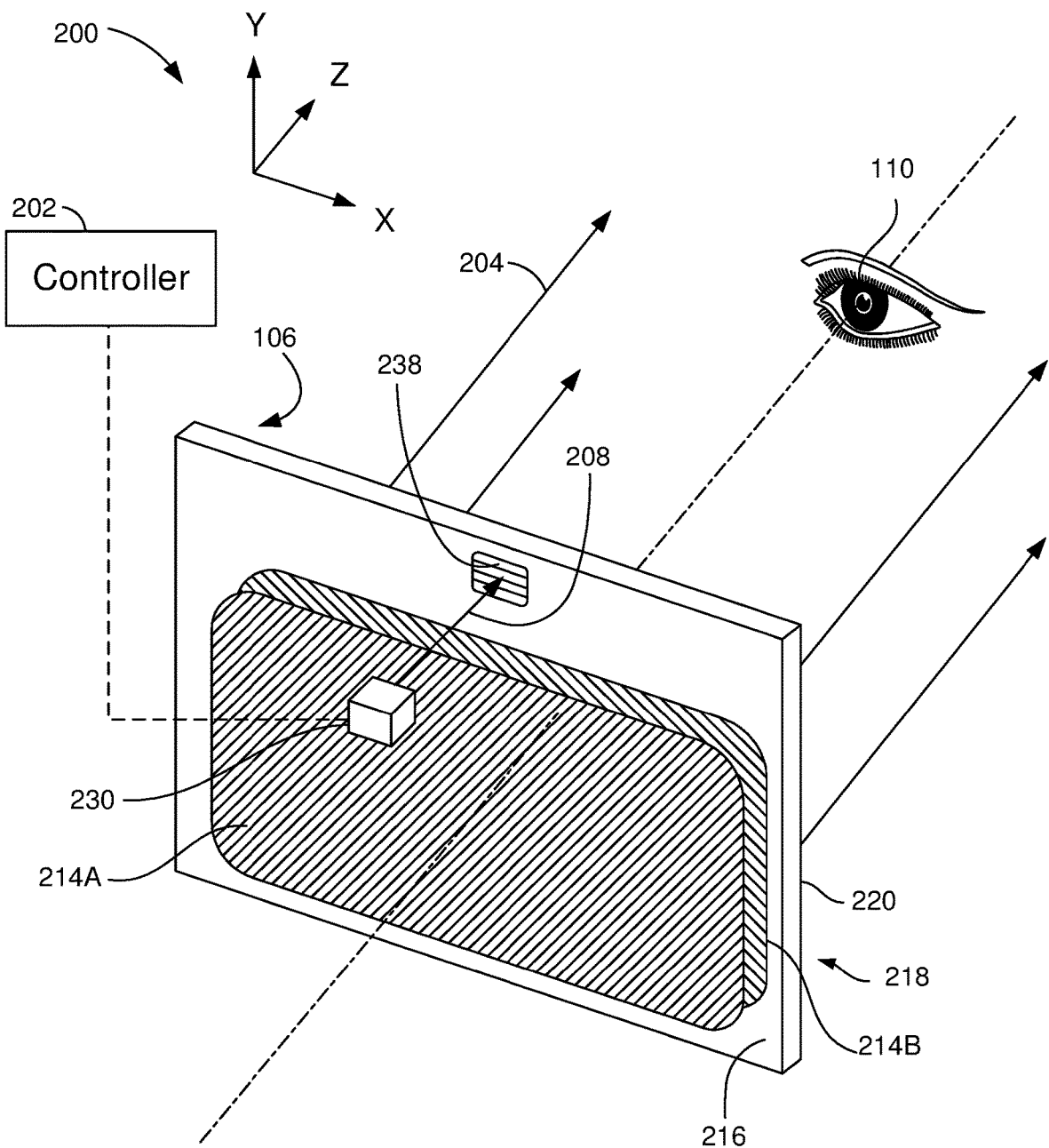
FIG. 2A illustrates an isometric view of an embodiment of a display device that is included in a head-mounted device.

Because of their small mass and feature size, as well as their low power requirements, light-emitting diodes (LEDs), as well as micro light-emitting diodes (μLEDs) are good candidate light sources for the pixels in head-mounted display devices (HMDs) and/or other devices that include near-eye display devices (NEDs). However, to achieve the luminance required for HMDs and other NEDs, a sufficient density of photons must be transmitted by the μLEDs. To transmit a sufficiently high density of photons from the light-emitting surfaces of the μLEDs, the shape of the μLEDs must be precisely controlled. Some methods of fabricating μLEDs include shaping the μLEDs via a mask formed by a photoresist reflow process. The shape of the fabricated μLED is highly sensitive to the shape of the photoresist mask (including the thickness of the mask), as well as the selectivity of the etch process. Because the shape of the photoresist mask is dependent upon the surface tension of the flowing photoresist, precisely controlling the shape of μLEDs across a wafer with sufficiently high uniformity is difficult. Furthermore, the etch selectivity is also difficult to control. For example, even a small amount of under-etching or over-etching will significantly affect the final shape of the μLED. Thus, conventionally fabricated μLEDs may suffer from irregular and/or non-uniform shapes, which significantly reduce the luminance and uniformity of the μLEDs, as well as the yield of the fabrication process Embodiments are directed towards enhanced systems and methods for fabricating conic section-shaped light-emitting components (LECs), such as but not limited to LEDs and μLEDs. The shape of the fabricated LECs is precisely controlled and highly uniform across a fabrication substrate (e.g., a wafer). In some non-limiting embodiments, the precisely controlled shape of the LECs is at least approximated by a conic section (e.g., parabola) solid of revolution. By precisely controlling the shape of the parabolic LECs, and providing a high-uniformity across the substrate, the luminance and process yield of the fabricated LECs is significantly enhanced. As used herein, the term "solid of revolution" refers to a 3D object and/or figure with a shape that is at least approximated by rotating a planar curve (e.g., a conic section) around an axis of revolution within the plane of the curve. A "conic section solid of revolution" may be a solid of revolution where the rotated curve includes a conic section (e.g., a parabola, circle, ellipse, or hyperbola). In some "parabolic solid of revolution" embodiments, the region near the vertex of the rotated parabola may be truncated. That is, the portion of the parabola surrounding the parabola's vertex may be removed such that the solid of revolution is a truncated solid of revolution.

The precise control and high uniformity of the shape of the LECs is enabled via a precisely shaped and highly uniform mask formed on an upper surface of the substrate. The ability to precisely control both the shape and uniformity of the mask is achieved by forming the mask utilizing three-dimensional (3D) patterning and/or machining methods (e.g., 2-photon lithography, nano-indentation, electron or ion beam lithography, or the like), rather than photoresist reflow techniques. As discussed throughout, in some embodiments for each LEC, the mask may include a precisely-shaped boss, with the same, or at least a similar, shape as the LEC to be fabricated, and a cylindrical protrusion extending beyond an upper portion of the boss. In some embodiments, the shape of the boss may vary somewhat, as compared to the shape of the LEC to be fabricated, based on various aspects of the fabrication process, e.g., etching sensitivities and the like. The combination of the boss and cylindrical protrusion allows for the mask to be over-etched, without significantly affecting the shape and/or size of the LEC. More specifically, the shape and/or size of a flat or truncated upper surface of the LEC may not be significantly affected. The shape and size of the cross-section of the truncated surface of the LEC will be similar to that of the cross-section of the cylindrical protrusion. However and in some non-limiting embodiments, the size and/or shape of portions of the LEC, other than the cross-section of the truncated surface, may vary from that of the mask, based on aspects and/or features of the etching process. Thus, due to at least the cylindrical protrusion, any non-uniformities in the selectivity of the etching process do not decrease the enhanced luminance, nor uniformity, of the LECs.

In some non-limiting embodiments, the fabricated LECs are micro light-emitting diodes (μLEDs). As described below, because the parabolic shape of the μLEDs is precisely controlled and highly uniform, the μLEDs are highly luminous, and thus are an ideal candidate for near-eye displays (NEDs), such as those employed in head-mounted devices (HMDs). Such HMDs that employ these highly luminous μLEDs may include, but are not limited to, virtual reality (VR) devices, augmented reality (AR) devices, and/or mixed-reality (MR) devices.

In the various embodiments, a mask is formed on a top surface of a semiconductor fabrication substrate. For each LEC to be fabricated from the substrate, the mask comprises a boss (e.g., a mesa that is shaped as a truncated conic section solid of revolution) contoured and/or shaped similarly to the desired contour and/or shape of the LEC. Accordingly, the shape of the boss may be at least approximated by a truncated parabolic solid of revolution. During fabrication of the LEC, the contour (or shape) of the boss is precisely transferred to a structure of the LEC (e.g., the body of the LEC), via an etching process. In non-limiting embodiments, the etching process may be a dry etching process. The etching process removes (i.e., etches) at least a portion of the mask (including the boss) from the substrate, as well as a portion of the substrate from the remaining substrate. By removing the portion of the substrate, the contour of the boss is precisely transferred to the structure of the LEC. Etching the mask and the portion of the substrate results in an LEC with a structure that is shaped similar to that of the boss. Thus, the LEC is fabricated in the shape of the boss.

The luminance (and thus process yield) for μLEDs is highly dependent upon the shape and uniformity of the μLED. To increase the luminance, a goal of μLED designers is to fabricate the μLED to act as a parabolic lens and position the focal plane of the μLED within the active layer of μLED, i.e., fabricating the μLED to act as a parabolic lens with the focal plane positioned within the volume of semiconductor material that generates the photons. Positioning the focal plane within the active layer enables the μLED to perform as a lens and transmit the photons as being focused at infinity. Thus, to increase the luminance and process yield of μLEDs, the shape and uniformity of the μLEDs should be tightly controlled. The shape of the fabricated μLED is highly dependent upon the shape of the mask (including the photoresist thickness), as well as the selectivity of the etching process. Forming a mask via a photoresist reflow process may be subject to a large variance in the shape of the mask. Any variation in either the shape of the mask or the selectivity of the etching process may significantly decrease the luminance and process yield of the μLEDs. For example, if the shape of the mask does not precisely match the desired parabolic shape, the focal plane of the μLED will not be positioned within the active layer. Furthermore, any slight over-etching or under-etching of the mask will significantly affect the shape of the μLED, leading to a similar undesired result. The various embodiments overcome these sensitivities by precisely controlling the shape and uniformity of the mask. Furthermore, the mask includes a cylindrical protrusion, which makes the final shape of the fabricated μLED relatively insensitive to any over-etching conditions, or other variances in the selectivity of the etching process. In some non-limiting embodiments, the shape of the boss may vary somewhat, as compared to the shape of the LEC to be fabricated, based on various aspects of the fabrication process, e.g., etching sensitivities and the like. More specifically, the shape and/or size of a flat or truncated upper surface of the LEC may not be significantly affected. The shape and size of the cross-section of the truncated surface of the LEC will be similar to that of the cross-section of the cylindrical protrusion. However and in some non-limiting embodiments, the size and/or shape of portions of the LEC, other than the cross-section of the truncated surface, may vary from that of the mask, based on aspects and/or features of the etching process.

Rather than forming the shape of the boss from a photoresist reflow process, the shape of the boss is formed via one or more three dimensional (3D) patterning and/or machining methods. The final shape of a mask formed via a photoresist reflow process is dependent upon the surface tension of the photoresist. The surface tension of a flowing photoresist, as well as the shape of an LEC fabricated from a masked formed via a reflow process, is difficult to control and highly dependent on the chemistry of the photoresist, thickness of the photoresist layer, etch selectivity, etch recipe, and environmental conditions (temperature, humidity, pressure, and the like). Forming the mask from a photoresist reflow process would not enable the tightly controlled and high-uniformity of the precisely shaped boss. Because, in the various enhanced embodiments herein, the boss is shaped from 3D patterning and/or machining, rather than a photoresist reflow process, the shape of the LECs across the substrate is tightly and precisely controlled. Thus, in the herein embodiments, the ability to precisely control and achieve high-uniformity of the shape (and thus the luminance and process yield) of the LECs across the substrate is significantly enhanced, as compared to LECs fabricated from a masked that was formed via a photoresist reflow process.

In addition to the precisely shaped boss, the mask may include a protrusion formed on an upper surface of the boss. The protrusion extends beyond an upper portion and/or surface of the boss. In non-limiting embodiments, the protrusion may be a cylindrical protrusion. Thus, the mask may include a cylinder-topped boss for each LEC to be fabricated from the substrate. The protrusion allows for a temporal buffer during the etching process. That is, the protrusion allows for the shape of the LEC to be insensitive to an over-etching condition during fabrication. As noted throughout, in some, but not all, non-limiting embodiments, the size and/or shape of at least some portions of the LEC may vary from that of the mask, based on aspects or characteristics of the fabrication process. As explained below, the presence of the protrusion enables the etching process to be extended longer than is required to completely remove the boss from the substrate (and transfer the shape of the boss to the LEC), without significantly affecting the shape of the LEC. More specifically, the protrusion allows for over-etching the boss/substrate, without significantly affecting the precisely controlled shape of the LEC. Thus, the various embodiments tolerate non-uniformities in the density of the etching particles across the substrate is not uniform, and because the mask/substrate can be over-etched, the uniformity of the shape of the LECs is precisely controlled across the substrate, even when the mask/substrate is over-etched and/or the density of the etching flow is non-uniform. The protrusion may be formed via the 3D patterning and/or machining methods utilized to form the boss. In contrast to the enhanced embodiments herein, because a photoresist reflow process is dependent upon the surface tension of the reflowing photoresist, forming the mask from a photoresist reflow process would not enable the formation of the over-etching enabling protrusion extending beyond the boss.

In the various embodiments discussed herein, the boss and the LEC are shaped as a conic section solid of revolution, e.g., a parabolic-shaped LEC. However, other embodiments are not so limited, and other conic sections, or non-conic shapes, may be employed. In some embodiments, the parabolic shape of the LEC acts to form a focal plane within an active layer of the LEC, e.g., in a parabolic-shaped μLED, the focal plane may be positioned within the active layer of the μLED. With the focal plane positioned within the active layer, the beam of photons transmitted by the μLED is sufficiently focused such that photons emerge from the light-emitting surfaces of the μLED within a relatively small solid angle, which provides a significant enhancement to the luminance of the μLED. That is, by precisely controlling the shape of the μLED to be parabolic and highly uniform, the beam of light transmitted by the photons is sufficiently collimated to significantly increase the luminance of the μLED. As discussed throughout, by forming the mask via 3D patterning and/or machining methods, as opposed to a photoresist reflow process, the shape and uniformity of the mask (and thus the fabricated μLEDs) are tightly controlled and highly uniform. The enhancements to the luminance and process yields are not achievable by forming the mask via a current photoresist reflow process.

The conic section solid of revolution shape of the boss may be characterized by an upper diameter, a lower diameter, and a boss height. In at least one embodiment, the upper diameter of the boss may be less than the lower diameter of the boss. In other embodiments, the upper diameter of the boos is greater than the lower diameter of the boss. The shape of the cylindrical protrusion may be characterized by a cylinder diameter and a cylinder height. More specifically, the boss may include two lateral surfaces (an upper and a lower lateral surface) and a longitudinal surface connecting the upper and lower surfaces. The cylindrical protrusion may include two circular lateral surfaces (e.g., an upper endcap and a lower endcap) characterized by the cylinder diameter. The cylindrical protrusion may also include a longitudinal surface connecting the upper and lower endcaps, which are separated by the cylinder height. In at least some embodiments, the upper diameter of the boss may be substantially similar to the cylinder diameter of the cylindrical protrusion.

The upper surface of the boss may be a substantially planar circular surface with a diameter substantially equivalent to the upper diameter of the boss. The lower surface of the boss may be a substantially planar circular surface with a diameter substantially equivalent to the lower diameter of the boss. In other embodiments, the upper and/or lower surfaces of the boss may be elliptical surfaces. The upper surface and the lower surface of the boss may be substantially parallel surfaces separated by the boss height. The contour of the boss may be such that the boss' longitudinal surface, which connects the upper and lower surfaces of the boss, is substantially similar to a conic section solid of revolution. The longitudinal surface of the boss may be a non-planar surface. In a non-limiting embodiment, the conic section may be a parabola. As discussed above, a parabolic-shaped LEC may provide for a significant enhancement of the LEC's luminance. The axis of revolution of the conic section solid of revolution may be orthogonal to the planes of the upper and lower surfaces of the boss.

Because the shape of the boss is transferred to the LEC, the LEC may include structures, surfaces, and physical dimensions that are analogous to the boss. For example, the LEC may include a circular upper lateral surface with an upper diameter substantially equivalent to the boss' upper diameter, a circular lower lateral surface with a diameter substantially equivalent to the boss' lower diameter, a longitudinal surface separating the parallel lower and upper lateral surfaces by an offset substantially equivalent to the boss' height, and an axis of rotation substantially orthogonal to the parallel upper and lower surfaces. Thus, as discussed herein, the lower diameter of the LEC may be substantially equivalent and/or similar to the lower diameter of the boss, the upper diameter of the LEC may be substantially equivalent and/or similar to the upper diameter of the boss, and the height of the LEC may be substantially equivalent and/or similar to the height of the boss. Because the shape of the boss is precisely transferred to the LEC during the etching process, the shape of the fabricated LEC may also be a conic section solid of revolution.

When formed on the substrate, both of the planar upper and lower surfaces of the boss may be substantially parallel with the upper surface of the substrate. The lower surface of the boss may be proximate to and positioned on top off the upper surface of the substrate, such that the upper surface of the boss is positioned above (and offset by the boss height from) the upper surface of the substrate. The lower endcap of the cylindrical protrusion may be adjacent to and positioned on top of the upper surface of the boss. Because, in some embodiments, the cylinder diameter and the upper diameter of the boss may be substantially similar diameters, and because both are circular surfaces, the perimeters and surface area of the lower endcap of the protrusion and the upper surface of the boss may be similar. Furthermore, the axis of rotation of the boss and the axis of rotation of the protrusion may be substantially aligned. Accordingly, the boss and the protrusion may share a common axis of rotation (i.e., an axis of symmetry). The lower endcap of the cylindrical protrusion may be offset from the upper surface of the substrate by a height substantially equal to the height of the boss. The upper endcap of the cylindrical protrusion may be offset from the upper surface of the substrate by a height substantially equal to the sum of the height of the boss and the cylinder height.

The cylindrical protrusion may be configured and arranged on the upper portion of the boss, such that the direction of particle flow in the etching process is substantially aligned with the axis of rotation of the cylindrical protrusion, as well as the axis of rotation of the boss. That is, the direction of the particle flow of the etching process is orthogonal to the planes of the protrusion's endcaps (and the planes of the lower and upper surfaces of the boss). As also noted above, the lower endcap of the cylindrical protrusion may be proximate to, aligned with, and positioned on top of the upper surface of the boss. The etching process that removes the boss and portions of the substrate may also remove at least a portion of the protrusion. However, because the direction of particle flow of the etching is substantially aligned with the axis of the cylindrical protrusion (and axis of the boss), the height of the cylinder is reduced during the etching, while the diameter of the protrusion (which substantially matches the upper diameter of the boss, and hence the upper diameter of the LEC) is conserved during etching. That is, the lateral cross section of the protrusion remains approximately constant during the etching process. Thus, after the etching process, a portion of the cylindrical protrusion (with a reduced height but conserved diameter) may remain on the upper surface of the LEC. Because only the height (and not the diameter) of the cylindrical protrusion is reduced during etching and the diameter of the protrusion is approximately equivalent to the upper diameter of the LEC, the etching process may continue after the boss is completely removed from the substrate, without effecting the shape of the LEC, until the cylindrical protrusion is completely removed from the substrate.

As a non-limiting example, the cylinder height may be approximately 1 µm. If the etching process decreases the height of the cylindrical protrusion at a rate of approximately 300 nm/min, then it would take over 3 minutes to completely etch away the cylindrical protrusion, before starting to significantly affect the shape of the µLED. That is, with the inclusion of the cylindrical protrusion, the etch process has a temporal buffer on the order of 180 seconds (s). Thus, the cylindrical protrusion provides a temporal buffer for the etching process, and enables over-etching of the mask, without significantly affecting the shape of the fabricated LECs. Accordingly, the shape of the LECs is tightly controlled and highly uniform, across the substrate. In various embodiments, the etching process is continued long enough to completely remove each boss from the substrate, but is terminated prior to the complete removal of any one of the cylindrical protrusions.

The mask, including the boss and the cylindrical protrusion, may be formed by 3D patterning and/or machining a positive photoresist material. Thus, after the etching is complete, and the shape of the boss has been transferred to the LEC, any portion of the cylinder protrusion remaining on the LEC may be removed by exposing the substrate to photons of the appropriate wavelength and/or intensity. That is, any remaining portion of the mask may be removed from the substrate by employing a photoresist-stripping process. Removing the remaining portion of the protrusion from the substrate exposes the upper surface of the LEC.

Although the various embodiments discussed herein are directed towards the fabrication of LECs based on the formation of a mask formed via 3D patterning and/or machining methods, it should be understood that the embodiments are not so limited and various other semiconductor devices may be fabricated via the enhanced embodiments discussed herein.

Exemplary Embodiment of a Head-Mounted Computing Device

The light-emitting components (e.g., micro light-emitting diodes) may be used in a near-eye display (NED) device included in a head-mounted device (HMD). As such, various embodiments, various embodiments of NEDs and HMDs will now be discussed. FIG. 1A is a diagram of a HMD 100 according to some embodiments. HMD 100 is one example embodiment of a head-mounted computing device. As such, HMD 100 may include a near-eye display (NED), which may include one or more display devices. The depicted embodiment includes a left display device 104A and a right display device 104B, which may be collectively referred to as the display device 104. The display device 104 may present content to a user. Examples of content presented by display device 104 may include, but are not limited to, one or more images, a series of images (e.g., a video), virtual objects, audio, or some combination thereof. As discussed throughout, display device 104 may include one or more arrays of light-emitting components, such as but not limited to one-dimensional (1D) or two-dimensional (2D) arrays of light-emitting diodes (LEDs). The light-emitting components may be affixed or bonded to a backplane of the display device 104.

In some embodiments, audio content may be presented via an audio device (e.g., speakers and/or headphones) of HMD 100. The audio device may receive audio content or information from the display device 104, a controller or processing unit of the HMD 100 (not shown), or an external device. The display device 104 may generally be configured to operate as an augmented-reality (AR) NED, such that a user can simultaneously view content projected (or otherwise presented) by the display device 104, and their real-world environment through the display device 104. In such embodiments, the display device 104 may augment views of a physical, tangible, and real-world environment with computer-generated (or virtual) elements (e.g., content including images, video, sound, and the like). However, in some embodiments, the display device 104 may be modified to additionally, or in the alternative, operate as a virtual-reality (VR) NED, a mixed-reality (MR) NED, or some combination thereof.

In addition to display device 104, HMD 100 may include a support or frame 102 that secures the display devices 104 in place on the head of a user. In some embodiments, the frame 102 may be a frame of eyewear glasses. HMD 100 may include at least one of a controller or a processing unit (e.g., a central processing unit, microcontroller, or microprocessor), a non-transitory, computer-readable storage device (e.g., volatile or non-volatile memory devices), and a communication transceiver (e.g., a wireless and/or wired network adaptor). As described herein in conjunction with some exemplary embodiments, the display device 104 may include a waveguide and holographic and/or volumetric Bragg gratings. The gratings may be generated by a process of applying one or more dopants or photosensitive media to predetermined portions of the surface of the waveguide, and subsequent exposure to ultraviolet (UV) light or other activating electromagnetic (EM) radiation. The various operations and/or functionalities of HMD 100 may be controlled via executing instructions on a processor device and/or controller device. When the instructions are executed, the processor device and/or controller device may cause the performance of various actions and/or steps. The instructions may be stored on a non-transitory computer-readable storage medium.

FIG. 1B illustrates a cross-sectional view of a portion of HMD 100, as shown in FIG. 1A, in accordance with some embodiments. The portion of the HMD 100 shown in FIG. 1B is associated with a single eye 110 of a user. The display device 104A may include at least one waveguide configuration 106. FIG. 1B shows an eye-box 108, which may be a location where the user's eye 110 is positioned when the user wears the HMD 100. When the eye 110 is aligned with the eye-box 108, the user may be visually provided a projected image, via the waveguide configuration 106. Waveguide configuration 106 directs the projected image towards the eye-box 108. The waveguide configuration 106 may receive and direct multiple pupil replications (i.e., replications of an image) towards the eye-box 108. For purposes of illustration, FIG. 1B shows a cross-section associated with a single eye 110 of the user and a single waveguide configuration 106. In some alternative embodiments, another waveguide configuration (which may be separate from the waveguide configuration 106 shown in FIG. 1B) may provide image light to another eye-box located with the other eye of the user, e.g., a waveguide configuration included in each of display devices 104A-104B of FIG. 1A.

The waveguide configuration 106, as illustrated in FIG. 1B, may be configured to direct image light (i.e., light that forms an image) to eye-box 108, which is positioned proximate the eye 110. The waveguide configuration 106 may be composed of one or more optical materials (e.g., plastic, glass, and the like) with one or more refractive indices that effectively minimize weight and widen a field-of-view (FOV) of the display device 104A. In alternative embodiments, the display device 104A may include one or more optical elements between the waveguide configuration 106 and the eye 110. The optical elements may act to manipulate light emitted from the display device 104A (e.g., image light emitted from display device 104A), perform one or more other optical adjustments to the light, or some combination thereof. Non-limiting examples of optical elements include an aperture, a Fresnel lens, a refractive (e.g., convex and/or convex) lens, a reflective surface, a filter, or any other suitable optical elements that manipulates light. Although not shown in FIG. 1B, the waveguide configuration 106 may include a waveguide with one or more sets of Bragg gratings.

In some embodiments, in order to achieve desired optical specifications or criteria, such as but not limited to a desired viewing angle, a maximum aperture size, a desired resolution, a minimum distortion level, a color correction, a back focal distance, and the like, the lenses (and other optical elements) described herein may include various designs. The lens or lenses may include a cylindrical lens, an anamorphic lens, a Fresnel lens, a gradient index lens, and the like. The lens may include a super lens, at least a portion of which having a negative index of refraction. The lens may include multiple lenses having various shapes. In some embodiments, the lens or lenses may include various optical materials. For example, a lens may include glass. In another non-limiting example embodiment, a lens can include a plastic material, such as but not limited to a CR-39 lens material, a urethane-based polymer, or a polycarbonate material.

FIG. 2A illustrates an isometric view of an embodiment of a display device 200 that is included in a head-mounted device. The various operations and/or functionalities of display device 200 may be controlled via executing instructions on a processor device and/or controller device. When the instructions are executed, the processor device and/or controller device may cause the performance of various actions and/or steps. The instructions may be stored on a non-transitory computer-readable storage medium.

Display device 200 may be included in HMD 100 of FIGS. 1A-1B. As such, display device 200 may be an embodiment of (or at least be similar to) display devices 104A-104B of FIGS. 1A-1B. In addition to the components discussed in conjunction with FIGS. 1A-1B, display device 200, or other components of HMD 100, may include source assembly 230, waveguide configuration 106, and controller 202. Waveguide configuration 106 may include at least a waveguide 220, a coupling element 238 a first (or top) decoupling element 214A, and a second (or bottom) decoupling element 214B. Waveguide 220 may include a top surface 216 and a bottom surface 218.

As shown in FIG. 2A, the bottom surface 218 of waveguide 220 and the second decoupling element 214B are facing the user's eye 110, while the top surface 216 of waveguide 220 and the first decoupling element 214A are facing towards the user's field-of-view (FOV) of the user's environment. Thus, the bottom surface 218 may be referred to as the user's surface of waveguide 220 and the second decoupling element 214B may be referred to as the user's decoupling element. In contrast, the top surface 216 may be referred to as the environment's surface of waveguide 220 and the first decoupling element 214A may be referred to as the environment's decoupling element. As discussed throughout, second decoupling element 214B outputs post-waveguide image light 204 to the user's eye 110. Thus, second decoupling element 214B may be referred to as the output decoupling element. As discussed in conjunction with FIGS. 2B-2C, source assembly 230 may include a light source and/or an optics system. In at least one embodiment, source assembly 230 may be referred to as a projector device, or simply a projector. Source assembly 230 may be an embodiment of (or at least be similar to) source assembly 230 of FIG. 2C.

Controller 202 may be an example of a central processing device (CPU), graphics processing unit (GPU), microcontroller, microprocessor, or some other logic-executing device, e.g., a field-programmable gate array (FPGA) or an application-specific integrated circuit (ASIC). Similar to FIG. 1B, display device 200 of FIG. 2A is associated with a single eye 110 of a user. As discussed in conjunction with FIG. 1A, another display device including HMD 100 may provide image light to the user's other eye. In some embodiments, one or more components of HMD 100 may be shared between the separate display devices for each eye. In still other embodiments, the single waveguide configuration 106 or display device 200 may provide post-waveguide image light 204 to both of the user's eyes. Waveguide 220 may be one of one or more waveguides included in waveguide configuration 106. Although only a single waveguide is shown in FIG. 2A, waveguide configuration 106 may include additional waveguides.

The source assembly 230 may generate pre-waveguide image light 208 that enters waveguide configuration 106, is transmitted via waveguide 220, and exits waveguide configuration 106, as post-waveguide image light 204. As used herein, prior to entering waveguide configuration 106, via coupling element 238, the image light may be referred to as pre-waveguide image light 208. After the transmitted image light exits waveguide configuration 106, via second decoupling element 214B, the image light may be referred to as post-waveguide image light 204. The pre-waveguide image light 208 may form one or more two-dimensional (2D) monochromatic or multi-chromatic images. The one or more images may be received by waveguide, via coupling element 238. The one or more images may be transmitted through waveguide 220 and outputted towards the user's eye 110, via waveguide 220 second decoupling element 214B. The post-waveguide image light 204 may provide the transmitted one or more 2D images to user's eye 110. In various embodiments, waveguide 220 is an output waveguide, because it outputs image light that is directed towards and received by the user's eye 110.

Figure 2B:
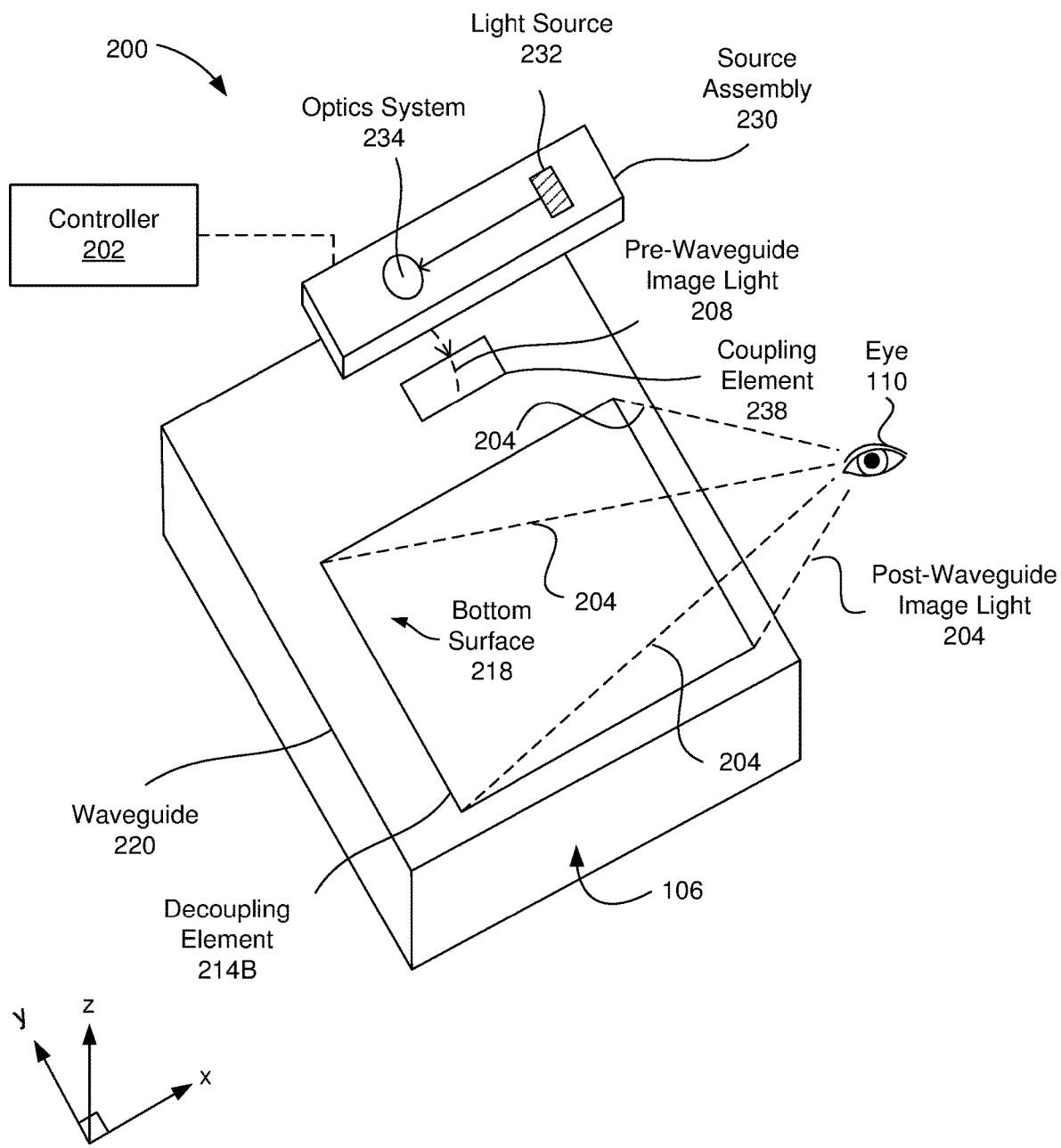
FIG. 2B illustrates a perspective view of another embodiment of a display device that is included in a head-mounted device.
Figure 2C:
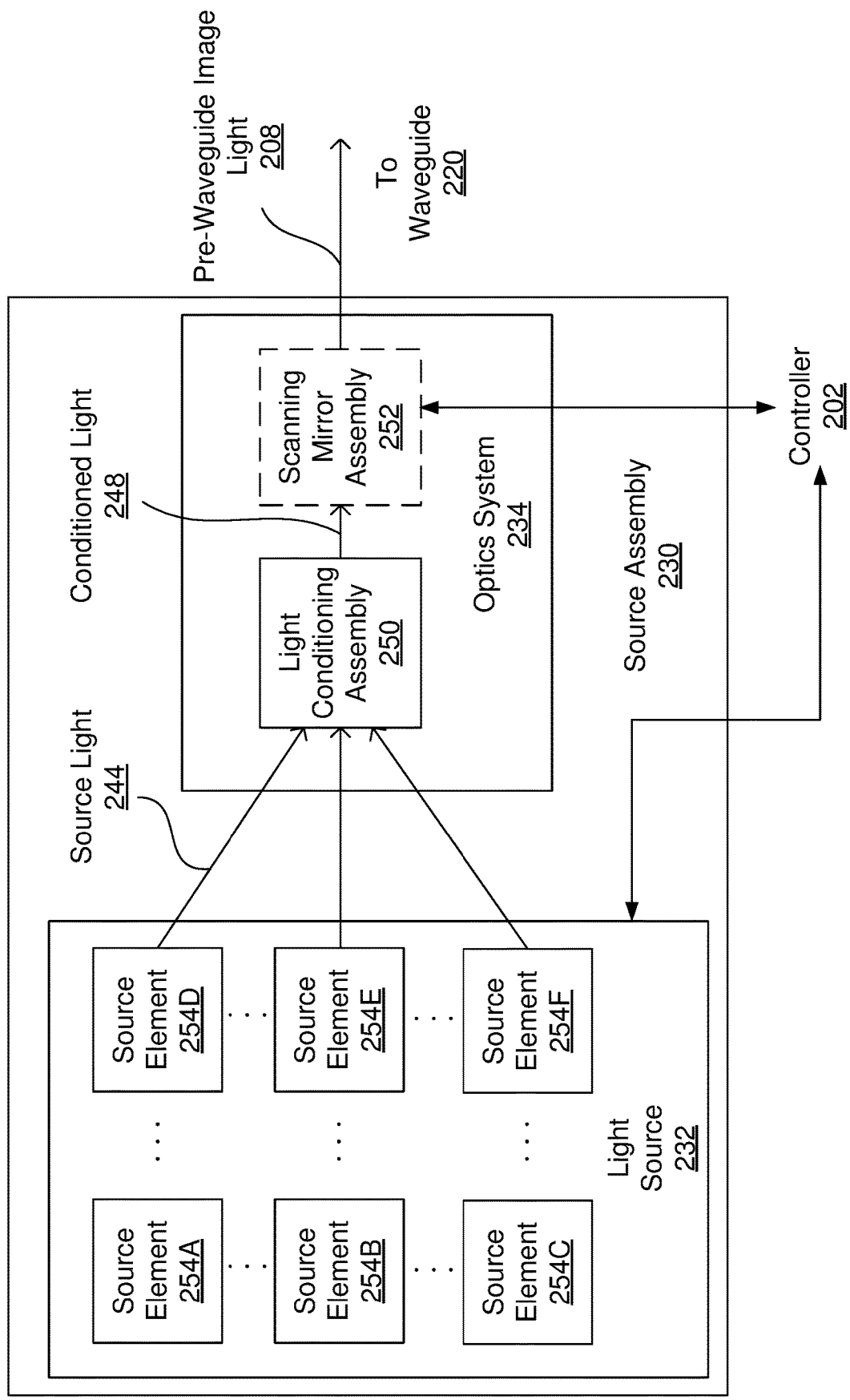
FIG. 2C illustrates a block diagram of the source assembly of FIGS. 2A-2B, in accordance with various embodiment.

Various embodiments of source assembly 230 are described in conjunction with at least FIGS. 2B-2C. As shown in FIGS. 2B-2C, source assembly 230 may include one or more 1D or 2D monochromatic or multi-chromatic light sources and an optics system. Various embodiments of light sources and optics systems are described in conjunction with at least FIGS. 2B-2C, 3, and 4. However, briefly here, light source (e.g., light source 232 of FIG. 2B-2C) may generate the pre-waveguide image light 208. The light source may include arrays (e.g., emitter arrays) of monochromatic or multi-chromatic light-emitting components (e.g., LEDs) which generate image light. The light-emitting components may be bonded to a backplane of source assembly 230. The light source may generate source light and the optics system may condition the source light to project the pre-waveguide image light 208 towards coupling element 238 located on the top surface 216 of the waveguide 220. The projected pre-waveguide image light 208 may include 2D image light that forms one or more 2D images.

In at least some embodiments, an optics system of the source assembly 230 may include a scanning mirror assembly that includes a scanning mirror that scans the generated pre-waveguide image light 208. The scan patterns of the scanning mirror assembly are such that the scanned pre-waveguide image light 208 forms the one or more 2D images. Such non-limiting embodiments may be referred to as scanning embodiments. The pre-waveguide image light 208 may propagate along a dimension or direction towards the coupling element 238, where the pre-waveguide image light 208 is received by and/or coupled to waveguide 220.

The waveguide 220 may be an optical waveguide that outputs 2D images, via 2D post-waveguide image light 204 that is directed to the eye 110 of the user. The waveguide 220 may receive pre-waveguide image light 208, projected via source assembly 230, at coupling element 238. The coupling element 238 may include one or more coupling elements located on the top surface 216 and/or within the body of waveguide 220. Coupling element 238 may guide and/or couple the received pre-waveguide image light 208 to a propagation area of the waveguide 220. Coupling element 238 may include a diffraction grating, a holographic grating, one or more cascaded reflectors, one or more prismatic surface elements, an array of holographic reflectors, a meta-material surface, or some combination thereof. An exemplary, but non-limiting, embodiment of the coupling element 238 may include a grating having a pitch of approximately 300 nm to approximately 600 nm. The coupling element 238 may be understood as extending from the top surface 216 to the bottom surface 218 of the waveguide 220. The coupling element 238 may redirect received pre-waveguide image light 208, according to a first grating vector, into the propagation area of the waveguide 220. Waveguide 220 may be included in and/or formed in the body of waveguide configuration 106. Waveguide 220 may be positioned between the first and second decoupling elements 214A-214B.

The first decoupling element 214A may redirect internally reflected image light from the waveguide 220. The second de-coupling element 214B may decouple the image light from waveguide 220 and direct the image light towards eye 110. In some embodiments, the internally-reflected image light may be totally, or at least near totally, internally reflected. The first decoupling element 214A may be part of, affixed to, or formed in the top surface 216 of the waveguide 220. The second decoupling element 214B may be part of, affixed to, or formed in the bottom surface 218 of the waveguide 220, such that the first decoupling element 214A is opposed to the second decoupling element 214B. A light propagation area may extend between decoupling elements 214A-214B. In some embodiments, there may be an offset between the opposed decoupling elements 214A-214B. The offset may be along the x-axis and/or the y-axis of the 3D Cartesian coordinates illustrated in FIG. 2A. The decoupling elements 214A-214B may include a diffraction grating, a holographic grating, a volumetric Bragg grating, one or more cascaded reflectors, one or more prismatic surface elements, an array of holographic reflectors, or the like. The decoupling elements 214A-214B may form a decoupling area of HMD 100.

In scanning embodiments, display device 200 may be a scanning display device. Various embodiments of scanning display devices are discussed in conjunction with FIGS. 2C and 5A. However, briefly here, source assembly 230 may provide one or more 1D or 2D images via scanning projected light at a scanning rate sufficient to form an apparent image. As such, source assembly 230 may include one or more scanning mirrors. However, in other embodiments, the display device 200 is not a scanning display device, and display device 200 is not required to include a scanning mirror.

Whether a scanning embodiment or a non-scanning embodiment, source assembly 230 may project a 2D image on an image field through waveguide 220, via one or more arrays of light-emitting components (i.e., emitter arrays) included in source assembly 230. In some embodiments, the image emitted by emitter arrays may be conditioned and/or magnified by an optics system and/or light conditioning assembly (e.g., one or more lenses) before the pre-waveguide image light 208 is received by waveguide 220. Such optics systems are discussed in conjunction with at least optics systems 234 of FIGS. 2B-2C.

In various embodiments, an orientation and/or position of post-waveguide image light 204 exiting from waveguide 220 may be controlled by changing an orientation of the pre-waveguide image light 208 entering the coupling element 238. In such embodiments, scanning components included in an optics system of source assembly 230 may re-orient and/or re-position pre-waveguide image light 208 prior to image light entering coupling element 238.

In various embodiments, one or more logic devices (such as controller 202) may control the operations of source assembly 230. As noted above, controller 202 may include any logic device, such as but not limited to a microprocessor, microcontroller, central processing unit (CPU), graphical processing unit (GPU), gate arrays (e.g., an FPGA), an ASIC, or the like. The controller 202 may generate display instructions for the source assembly 230. The display instructions may include instructions to project one or more monochromatic or multi-chromatic images. Display instructions may include an image file (e.g., a bitmap). The display instructions may be received from another processing device included in HMD 100, a memory device of HMD 100, non-transitory computer-readable media, and/or a wireless/wired communication network. As described herein, the display instructions may further include instructions for moving (e.g., scanning) optical components within the source assembly 230, or individual light-emitting arrays included therein, or for moving the waveguide 220 by activating an actuation system. The controller 202 may include a combination of hardware, software, and/or firmware not explicitly shown herein so as not to obscure other aspects of the disclosure. The software and/or firmware may be stored via a storage device or non-transitory computer-readable media of HMD 100 or another computing device.

FIG. 2B illustrates a perspective view of another embodiment of display device 200. The embodiment of display device 200, shown in FIG. 2B, may also be included in a HMD, such as but not limited to HMD 100 of FIGS. 1A-1B. The embodiment of display device 200 shown in FIG. 2B may be an embodiment of (or at least similar to) any of display devices 104A-104B of FIGS. 1A-2A or display device 200 of FIG. 2A. Similarly to the embodiment shown in FIG. 2A, display device 200 includes various components, e.g., the waveguide configuration 106 or part of the waveguide configuration 106, controller 202, and source assembly 230. In alternative embodiments, the display device 200 is included in other HMDs, or in other systems that provide projected image light to a particular location.

Similar to the embodiment shown in FIG. 2A, display device 200 of FIG. 2B includes waveguide configuration 106. Waveguide configuration 106 includes waveguide 220, coupling element 238, and decoupling element 214B. Due to the perspective view of FIG. 2B, the bottom surface 218 of waveguide 220 is shown, but the top surface 216 of waveguide 220 is occluded by waveguide configuration 106. Similarly, the second decoupling element 214B is visible in FIG. 2B, but the first decoupling element 214A is occluded by the waveguide configuration 106. As shown in more detail in FIG. 2C, source assembly 230 may include light source 232 and optics system 234. Optics system 234 may include a light conditioning assembly 250. In various scanning embodiments, display device 200 may be a scanning display device. In such embodiments, optics system 234 may include a scanning mirror assembly 252.

Figure 5A:
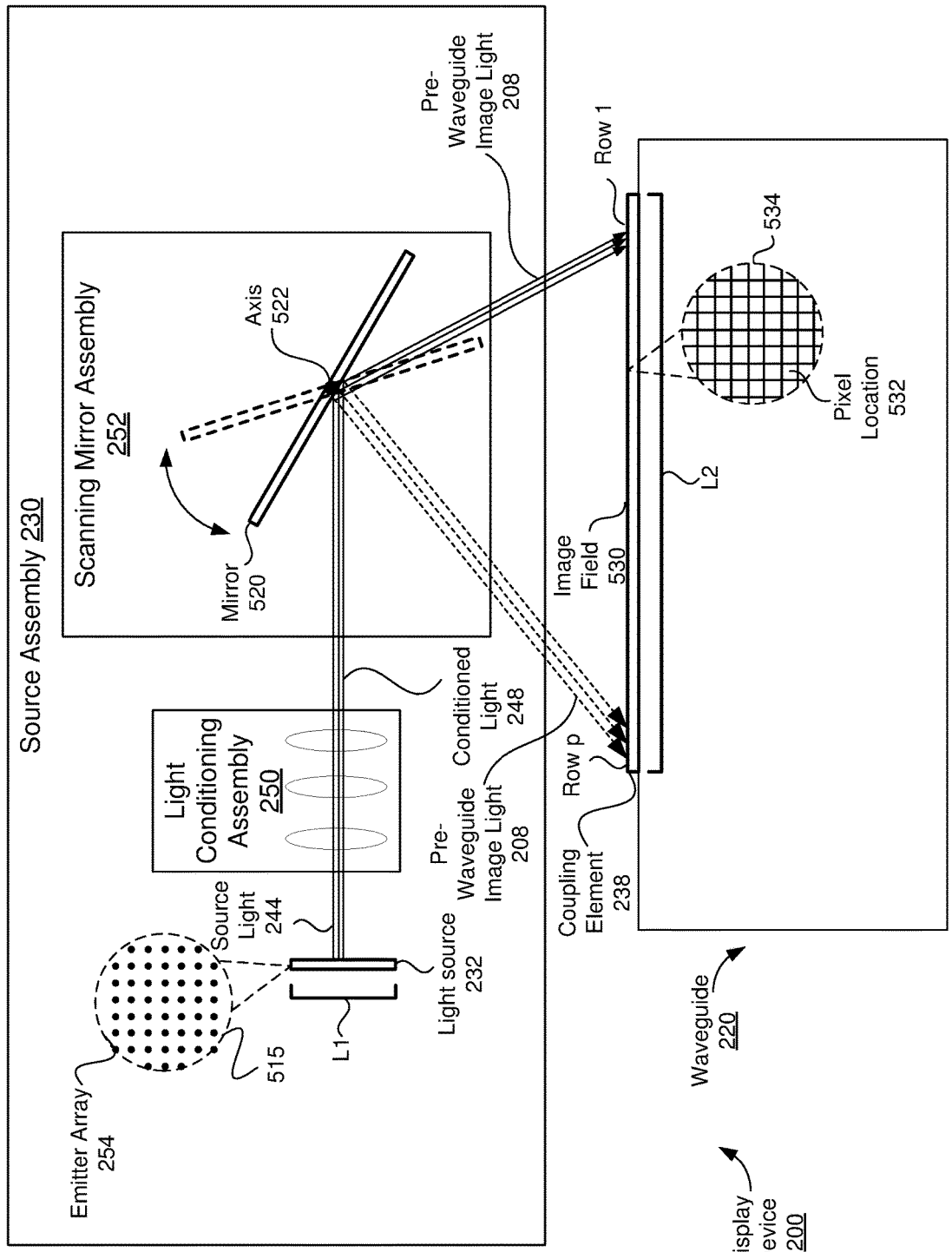
FIG. 5A is a diagram illustrating a scanning operation of a scanning embodiment of a display device, in accordance with an embodiment.

Various embodiments of a scanning display device are discussed in conjunction with at least FIG. 2C and FIG. 5A. However, briefly here, display device 200 may provide one or more 1D or 2D images via scanning projected light at a scanning rate sufficient to form an apparent image. As such, display device 200 may include one or more scanning mirrors. For instance, a scanning mirror assembly, which includes a scanning mirror, may be included in an optics system of source assembly 230. However, in other embodiments, the display device 200 is a non-scanning display device, and display device 200 need not include a scanning mirror assembly.

Figure 5B:
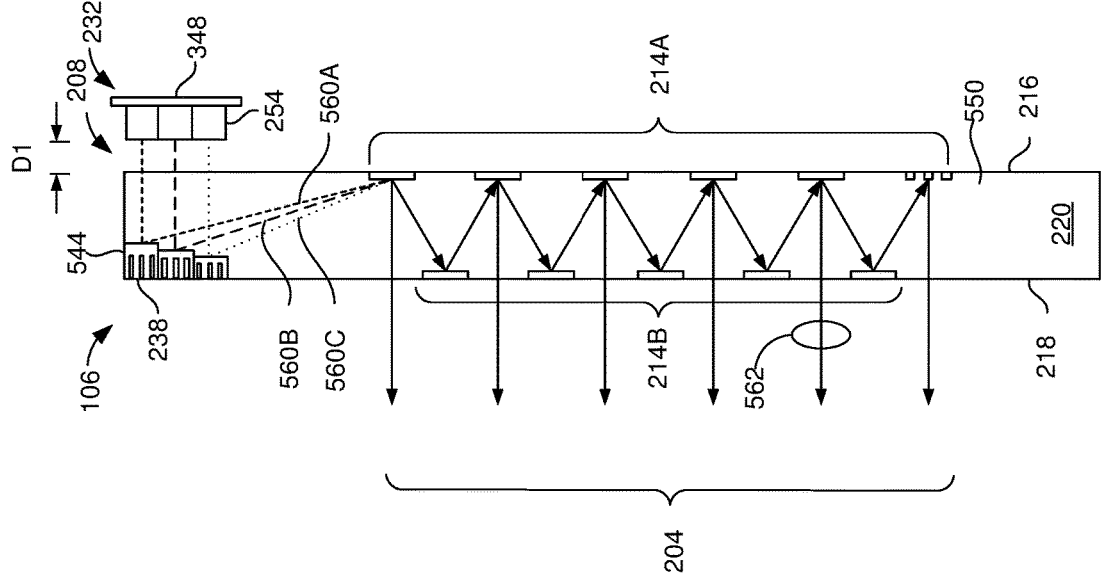
FIG. 5B illustrates a waveguide configuration of a display device that forms images and replications of images, in accordance with various embodiments.

As discussed in conjunction with at least FIG. 2A and FIGS. 5A-5B, the source assembly 230 may project (scanned or non-scanned) image light on an image field through waveguide configuration 106, via one or more 1D and/or 2D arrays of light-emitting components (i.e., emitter arrays) included in light source 232. In scanning embodiments, a scanning mirror may be employed to scan the pre-waveguide image light 208 in such a manner to form scanned images on the image field. In some scanning embodiments, as well as non-scanning embodiments, the image emitted by emitter arrays included in light source 232 may be conditioned and/or magnified by optics system 234 and/or light conditioning assembly (e.g., one or more lenses) before the light is received by coupling element 238 and coupled to waveguide 220 or a screen. Such optics systems are discussed in conjunction with at least optics systems 234 of FIG. 2C.

Similar to FIGS. 1B and 2A, display device 200 may provide images for both eyes or for a single eye 110. For purposes of illustration, FIG. 2B shows the display device 200 associated with a single eye 110. Another display device (not shown), that is separated (or at least partially separated) from the display device 200, may provide image light to another eye of the user. In a partially separated system, one or more components may be shared between display devices for each eye.

The source assembly 230 may be an embodiment of (or at least be similar to) source assembly 230 of FIG. 2C. As such, the source assembly 230 generates pre-waveguide image light 208. The source assembly 230 includes a light source 232 and an optics system 234. The light source 232 is an optical component that generates pre-waveguide image light 208 using a plurality of light emitters arranged in a matrix, i.e., emitter arrays composing light-emitting components (LECs) or light emitters. Each light emitter may emit monochromatic light emitter. The light source 232 generates pre-waveguide image light 208 including, but not restricted to, red (R) image light, blue (B) image light, green (G) image light, infra-red image light, or image light of any other wavelength. While RGB image light, LECs, and pixels are often discussed in this disclosure, embodiments described herein are not limited to using red, blue and green as primary colors. Other colors are also possible to be used as the primary colors of the display device 200. Also, a display device in accordance with an embodiment may use more than three primary colors. Light source 232 may be an embodiment of, or at least be similar to, one of light sources 300 of FIG. 3.

The optics system 234 performs a set of optical processes, including, but not restricted to, focusing, combining, conditioning, and scanning processes on the image light generated by the light source 232. In some embodiments, the optics system 234 includes a light conditioning assembly that conditions pre-waveguide image light 208. In scanning embodiments, optics system 234 may include a scanning mirror assembly, as described below in detail in conjunction with at least FIGS. 2C and 5A. The source assembly 230 generates and outputs pre-waveguide image light 208. Similar to display device of FIG. 2A, the pre-waveguide image light 208 is received by coupling element 238, as is coupled to, as well as transmitted by, the waveguide 220.

The waveguide 220 is an optical waveguide that outputs post-waveguide image light 204 to an eye 110 of a user. The waveguide 220 receives the pre-waveguide image light 208 at one or more coupling elements 238, and guides the received input image light to one or more decoupling elements 214B. The coupling element 238 may be, for example, a diffraction grating, a holographic grating, some other element that couples the pre-waveguide image light 208 into the waveguide 220, or some combination thereof. For example, in embodiments where the coupling element 238 is diffraction grating, the pitch of the diffraction grating is selected such that total (or at least near total) internal reflection occurs, and the pre-waveguide image light 208 propagates internally toward the decoupling element 214B. The pitch of the diffraction grating may be in the range of 300 nm to 600 nm.

The decoupling element 214B decouples and/or outputs the total (or near total) internally reflected image light from the waveguide 220. Thus, waveguide may be an output waveguide. The decoupling element 214B may be, for example, a diffraction grating, a holographic grating, some other element that decouples image light out of the waveguide 220, or some combination thereof. For example, in embodiments where the decoupling element 214B is a diffraction grating, the pitch of the diffraction grating is chosen to cause incident image light to exit the waveguide 220. In scanning embodiments, an orientation and position of the post-waveguide image light 204 exiting from the waveguide 220 may be controlled by changing an orientation and position of the pre-waveguide image light 208 entering the coupling element 238. The pitch of the diffraction grating may be in the range of 300 nm to 600 nm.

The waveguide 220 may be composed of one or more materials that facilitate total (or near total) internal reflection of the pre-waveguide image light 208. For example, the waveguide 220 may be composed of silicon, plastic, glass, or polymers, or some combination thereof. The waveguide 220 has a relatively small form factor. For example, the waveguide 220 may be approximately 50 mm wide along X-dimension, 30 mm long along Y-dimension and 0.5-1 mm thick along Z-dimension.

Similarly to controlling the operations of the embodiments of source assembly 230 of FIG. 2A, controller 202 may control the image rendering operations of the embodiment of source assembly 230 shown in FIG. 2B. The controller 202 determines instructions for the source assembly 230 based at least on the one or more display instructions. Display instructions are instructions to render one or more images. In some embodiments, display instructions may be an image file (e.g., bitmap). In another example, the display instructions may be received from a console of a augmented-reality (AR) system, a virtual-reality (VR) system, and/or a mixed-reality (MR) system, not shown in FIG. 2B. In scanning embodiments, display instructions may include scanning instructions that are used by the source assembly 230 to generate images via scanning pre-waveguide image light 208. For example, the scanning instructions may include a type of a source of image light (e.g., monochromatic, polychromatic), a scanning rate, an orientation of a scanning apparatus, one or more illumination parameters, or some combination thereof. The controller 202 includes a combination of hardware, software, and/or firmware not shown here so as not to obscure other aspects of the disclosure.

FIG. 2C illustrates a schematic block diagram of the source assembly 230 of FIGS. 2A-2B, in accordance with various embodiment. That is, source assembly 230 of FIG. 2C may be an embodiment of (or at least similar to) source assembly 230 of FIG. 2A and/or source assembly 230 of FIG. 2B. As such, source assembly 230 includes a light source 232 and an optics system 234. In some embodiments, source assembly 230 may be a scanning source assembly, while in other embodiments, source assembly 230 is a non-scanning source assembly. The various operations and/or functionalities of source assembly 230 may be controlled via executing instructions on a processor device and/or controller device. When the instructions are executed, the processor device and/or controller device may cause the performance of various actions and/or steps. The instructions may be stored on a non-transitory computer-readable storage medium.

Light source 232 includes a plurality of source elements, shown schematically as source elements 254A-254F. Source elements may include an array of light-emitting components (LECs), i.e., a source element may include and/or be an embodiment of an emitter array. Various embodiments of emitter arrays are discussed in conjunction with FIGS. 3-4. However, briefly here, an emitter array may be a 2D arrays of LECs, such as but not limited to light-emitting diodes (LEDs). As discussed below, the number, arrangement, and configuration of the plurality of source elements may vary based on whether the source assembly is a scanning source assembly, or a non-scanning source assembly.

Optics system 234 includes a light conditioning assembly 250. In scanning embodiments, in addition to light conditioning assembly 250, optics system 234 may include a scanning mirror assembly 252. In non-scanning embodiments of source assembly 230, the optics system 234 need not, but may, include scanning mirror assembly 252. Because the inclusion of scanning mirror assembly 252 is optional, depending upon whether source assembly 230 is a scanning or non-scanning embodiment, scanning mirror assembly 252 is indicated in FIG. 2C via a dashed box.

In non-scanning embodiments, light source 232 may include more source elements (e.g., emitter arrays), than in scanning embodiments. In non-scanning embodiments, there may exist a one-to-one mapping (or correspondence) between individual LECs included in the source elements and pixel regions of a display device, such as but not limited to pixel regions of display device 104 of FIGS. 1A-1B and/or display device 200 of FIGS. 2A-2B. In scanning embodiments, each LEC may be mapped to more than one pixel region of a display device. For example, a scanning mirror included in scanning mirror assembly 252 may be employed to scan light emitted by a single LEC to multiple pixels of the display device. Thus, via the scanning mirror assembly 252, a single LEC may illuminate multiple LECs, and thus less source elements may be required for scanning embodiments. For example, in a scanning embodiment of source assembly 230, light source 232 may include source elements 254A-254C, whereas in a non-scanning embodiment, light source 232 may include source elements 254A-254C, as well as source elements 254D-254F.

Because scanning embodiments may include less source elements, the source elements in a scanning embodiment may be referred to as a "1D" arrangement of source elements or emitter arrays. The source elements in a non-scanning embodiment may be referred to as a "2D" arrangement of source elements or emitter arrays. Note that even though the 1D and 2D nomenclatures are employed, each of the source elements (e.g., source element 254A) may include a 2D array of LECs. That is, in scanning embodiments that include source elements 254A-254C, but do not include source elements 254D-254F, the included source elements are said to be arranged in a 1D array, i.e., a 1D arrangement of 2D emitter arrays. In non-scanning embodiments that include source elements 254A-254F, the included source elements are said to be arranged in a 2D array, i.e., a 2D arrangement of 2D emitter arrays. It should also be noted that the 1D arrangement of source elements 254A-254C and the 2D arrangement of source elements 254A-254F are illustrative only, and the total number of, arrangements of, and configurations of source elements may vary from embodiment to embodiment. The source assembly 230 may generate light in accordance with scanning instructions from the controller 202.

The light source 232 is a source of light that generates image light. In some embodiments, the image light is collimated or at least partially collimated image light. In other embodiments, the image light need not be collimated. The light source 232 emits light in accordance with one or more illumination parameters received from the controller 202. As discussed above, the light source 232 includes one or more source elements 254A-254C, and/or source elements 254A-254F, either configuration which may be collectively referred to as source elements 254. Source elements may be comprised of light-emitting components (LECs), as discussed throughout.

The individual source elements 254 of an emitter array may include one or more compact, efficient and/or powerful sources of lights, e.g., LECs with at least ultra-high brightness, low power consumption, and a low footprint. The source elements 254 may include one or more arrays of light-emitting components (LECs), such as but not limited to light-emitting diodes (LEDs), e.g., µLEDs, organic LEDs (OLEDs), a superluminescent LED (SLED), and organic µLEDs. A µLED may be an LED with features sizes ranging between sub-microns to a hundreds of microns. Various embodiments of µLEDs are discussed in conjunction with FIGS. 6A-6B. In some embodiments, GaN-based inorganic LEDs can be made orders of magnitude brighter than OLEDs with a light emission area of few microns.

In one embodiment, the source elements 254 may be arranged in a concave curved fashion. For example, the source elements 254 may have a radius of curvature ranging from few millimeters to few centimeters depending on the display size and a length of few millimeters. An advantage of a curved array is that it is easier to form a compact lens to have high quality image on curved surface without correcting the field of curvature of the lens. In alternate embodiments, the source elements 254 may be arranged in a flat and/or linear fashion.

The source element 254 emits a source light 244 to the optics system 234. In some embodiments, the source light 244 may emit one or more colors (e.g. red, green, and blue). For example, the source element 254A may emit red source light, the source element 254B may emit blue source light, and the source element 254C emits green source light. In non-scanning embodiments that additionally include source elements 254D-254F, the source element 254AD may emit red source light, the source element 254E may emit blue source light, and the source element 254F emits green source light. Additionally, in some embodiments, one or more of the source elements may emit light in the infrared, or light of other non-visible wavelengths.

The optics system 234 may include a light conditioning assembly 250 and a scanning mirror assembly 252. The light conditioning assembly 250 conditions the source light 244 and emits conditioned light 248. In embodiments that include scanning mirror assembly 252, the conditioned light is provided to the scanning mirror assembly 252. In scanning embodiments, light condition assembly 250 may condition source light 244 for incidence on scanning mirror assembly 252. In non-scanning embodiments, light condition assembly 250 may condition source light 244 for being received by a waveguide configuration, such as but not limited to waveguide configuration of FIG. 1B and FIGS. 2A-2B. The light conditioning assembly 250 includes one or more optical components that condition the light from the light source 232. Conditioning light from the light source 232 may include, for example, expanding, collimating, correcting for one or more optical errors (e.g., field curvature, chromatic aberration, etc.), some other adjustment of the light, or some combination thereof. The light conditioning assembly 250 conditions the source light 244 and emits conditioned light 248. In non-scanning embodiments, conditioned light 248 may be outputted as pre-waveguide image light 208. In scanning embodiments, the conditioned light 248 may be received my scanning mirror assembly 252, and scanned and/or further conditioned being outputted as pre-waveguide image light 208.

The scanning mirror assembly 252 includes one or more optical elements that redirect image light via one or more reflective portions of the scanning mirror assembly 252. Where the image light is redirected towards is dependent upon specific orientations of the one or more reflective portions. In some embodiments, the scanning mirror assembly 252 includes a single scanning mirror that is configured to scan in at least two dimensions. In other embodiments, the scanning mirror assembly 252 may include a plurality of scanning mirrors that each scan in orthogonal directions to each other. The scanning mirror assembly 252 may raster scan (horizontally, or vertically). In some embodiments, the scanning mirror assembly 252 may perform a controlled vibration along the horizontal and/or vertical directions with a specific frequency of oscillation to scan along two dimensions and generate a two-dimensional projected line image of the media presented to user's eyes. For example, the scanning mirror assembly 252 may undergo an oscillation with peak-to-peak amplitude of few hundreds of nanometers per second along the vertical direction based on the desired frequency of oscillation. The scanning mirror assembly 252 emits a pre-waveguide image light 208 based on the conditioned light 248. The scanning mirror assembly 252 outputs the pre-waveguide image light 208 at a particular orientation (in accordance with the scanning instructions) and towards a waveguide configuration.

In some embodiments, the scanning mirror assembly 252 includes a galvanometer mirror. For example, the galvanometer mirror may represent any electromechanical instrument that indicates that it has sensed an electric current by deflecting a beam of image light with one or more mirrors. The galvanometer mirror may be configured to scan in at least one orthogonal dimension to generate the scanned pre-waveguide image light 208. The pre-waveguide image light 208 from the galvanometer mirror represents a two-dimensional line image of the media presented to user's eyes. As noted above, in non-scanning embodiments, source assembly 230 need not include scanning mirror assembly 252.

The controller 202 controls the light source 232 and/or the scanning mirror assembly 252. The controller 202 takes content for display, and divides the content into discrete sections. The controller 202 instructs the light source 232 to sequentially present the discrete sections. In scanning embodiments, the controller 202 instructs the scanning mirror assembly 252 to scan the presented discrete sections to different areas of a coupling element 238 of the waveguide 220. Accordingly, when scanned light 238 exits the waveguide 220, separate portions of scanned light 238 are presented in different locations of the coupling element 238. While each discrete section is presented at different times, the presentation and scanning of the discrete sections occurs fast enough such that a user's eye integrates the different sections into a single image or series of images. In non-scanning embodiments, the controller 202 instructs the light source 232 to present different areas of the coupling element 238 of the waveguide 220 into different discrete sections.

For example, in scanning embodiments, controller 202 segments the content into scan lines, via scanning instructions. The scan lines are scanned out to different areas of the coupling element 238 of the waveguide 220. When scanned pre-waveguide image light 208 exits the waveguide 220, each of the lines are presented at a different location, as post-waveguide image light 204, which a user's eye integrates into a single 2D image or series of 2D images.

For example, the scanning instructions may cause the source assembly 230 to scan out an image in accordance with a scan pattern (e.g., raster, interlaced, etc.). The scanning instructions control an intensity of light emitted from the light source 232, and the optics system 234 scans out the image by rapidly adjusting orientation of the emitted light. If scanned at a sufficient frequency, a human eye integrates the scanned pattern into a single 2D image. In non-scanning embodiments, the source assembly 230 may similarly generate 2D images without the need for a scan pattern because the light source 232 includes one or more LECs for each pixel of the display device. For example, based on display instructions, controller 202 may operate individual LECs included in source elements 254A-254F to illuminate pixels corresponding the 2D images.

Figure 3:
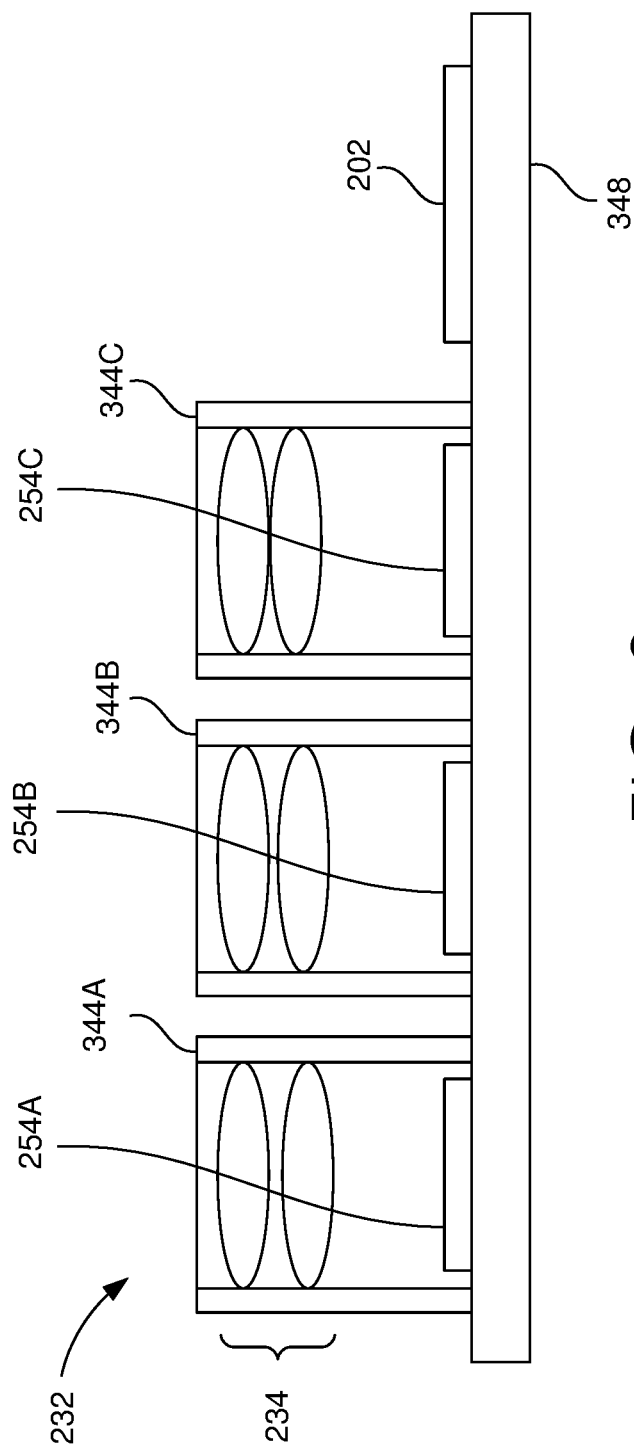
FIG. 3 illustrates a cross-sectional view of an embodiment of a light source included in the display device of FIGS. 2A-2C, in accordance with the various embodiments.

FIG. 3 illustrates a cross-sectional view of an embodiment of light source 232 included in the display device of FIGS. 2A-2C, in accordance with the various embodiments. As shown in FIG. 3, one embodiment of a light source 232 may include a first source element 254A, a second source element 254B, and a third emitter array 254C. As used herein, the terms source element and emitter array may be used interchangeably. Each of the emitter arrays 254A, 254B, and 254C may be disposed in an array housing 344A, 344B, and 344C, respectively. For convenience, the emitter arrays 254A-254C may be referred to collectively as emitter arrays 254, and also individually as emitter array 254. Similarly, the array housings 344A-344C may be referred to collectively as array housings 344, or individually as array housing 344. As discussed in conjunction with at least FIG. 2C, each of the emitter arrays 254 may include a 2D array of light-emitting components (e.g., LEDs). FIG. 3 illustrates a 1D arrangement of emitter arrays for a scanning embodiment. However, as discussed in conjunction with at least FIG. 2C, a 2D arrangement of emitter arrays may be employed for non-scanning embodiments.

Each of the array housings 344 may include an optics system 234, which may include one or more optical components, such as lenses (e.g., glass, plastic, or meta-material lenses), prisms, filters, scanning mirrors, and the like. As discussed in conjunction with FIG. 2C, optics system 234 may include a light conditioning assembly. In scanning embodiments, optics system 234 may additionally include a scanning mirror assembly, such as but not limited to scanning mirror assembly 252 of FIG. 2C. In other embodiments, the optics system 234 is not housed within housings 344. Each of the source elements 254A-254C may include a separate and/or distinct optics system.

As discussed in conjunction with at least FIG. 2C, the optics system 234 may condition and/or alter the direction or control other characteristics of source light 244 emitted by emitter arrays 254. As shown in FIG. 3, the emitter arrays 254 may be secured to a common structure, such as a backplane 348 or printed circuit board (PCB). The backplane 348 may include a logic device, such as but not limited to an ASIC, processor, FPGA, controller 202, or the like. Backplane 348 may include electrical contacts (e.g., leads) that electrically couple individual LECs of the emitter arrays 254 to controller 202. In other embodiments, the controller 202 may be disposed elsewhere on the HMD 100 of FIGS. 1A-1B, secured either directly or indirectly to the frame 102 of FIG. 1A.

Each of the emitter arrays 254 may be a monochromatic emitter array having a 1D or 2D configuration of individual emitters (e.g., LEDs) of a single color. As described herein, a green colored light may be understood as light composed of photons with a range of wavelengths between about 500 nanometers (nm) to about 555 nm. Furthermore, as described herein, red colored light may be understood as light composed of photons with a range of wavelengths between about 622 nm to about 780 nm. Blue colored light may be understood as light composed of photons with a range of wavelengths between about 440 nm to about 492 nm. A monochromatic emitter array 254 may emit light within a narrow wavelength range, rather than a single wavelength, in some embodiments. For example, a monochromatic emitter array 254 may emit colored light (e.g., red, green, or blue photons) within a narrow wavelength range of 5-10 nm in width.

One or more chromatic filters, which may facilitate a simplified projection lens design with reduced achromatic performance requirements, may be employed to further narrow the wavelength range of an emitter array. In some embodiments, the emitter array 254A may include only red light-emitting components, the emitter array 254B may include only green light-emitting components, and the emitter array 254C may include only blue light-emitting components. Under the direction of controller 202, each of the emitter arrays 254A-254C may produce a monochromatic 2D image according to the color produced by its respective emitters. Accordingly, the three monochromatic emitter arrays 254A-254C may simultaneously emit three monochromatic images (e.g., a red image, a green image, and a blue image composed of image light) towards optics system 234.

As discussed elsewhere, the three monochromatic images may be interposed, composited, or otherwise combined to generate a full color image. For example, the controller 202 may receive a full-color image to be displayed to a user and then decompose the full-color image into multiple monochromatic images, such as a red image, a green image, and a blue image. That is, the full-color image may be separated, or otherwise decomposed into three monochromatic images of primary colors. As described herein, the waveguide configuration 106 of FIG. 1B and FIGS. 2A-2B may combine (or recombine) the three monochromatic images to produce a full-color image or a poly-chromatic (or multi-chromatic) image, via post-waveguide image light 204 and directed toward the eye 110 of FIG. 1B and FIGS. 2A-2B. In yet other examples, one or more emitter arrays 254A-254C may produce light of multiple wavelengths, ranges of wavelengths, or other forms of light other than monochromatic light.

In some embodiments, a calibration and/or alignment system (not shown in FIG. 3) may be employed to align the multiple monochromatic images (e.g., via mechanical movement, or scanning, of one or more of the monochromatic emitter arrays 254A-254C or movement of the one or more of the monochromatic images by one or more pixels as emitted from their associated monochromatic emitters 254A-254C) to produce a desired or intended, properly aligned multi-chromatic image.

FIG. 4 shows a top view of light source 232 that includes a 1D configuration of emitter arrays 254A-254C, according to some embodiments. The 1D configuration shown in FIG. 4 is a linear configuration of 2D emitter arrays 254A-254C along the A1 axis. In the embodiment of FIG. 4, the individual emitter arrays 254A-254C have an aspect ratio greater than 1.0 (i.e., emitter arrays 254 are rectangular 2D arrays of LECs). However, in other embodiments, the aspect ratio of the emitter arrays 254A-254C may be equal to 1.0 (i.e., emitter arrays 254 are square 2D arrays of LECs). The particular linear configuration may be arranged according to a longer side of the rectangular arrays 254A-254C. While the emitter arrays 254A-254C may have a 1D configuration of the emitters (e.g., LEDs) in some scanning embodiments, in other non-scanning embodiments, the emitter arrays 254 may be arranged in a (square or rectangular) 2D configuration. In yet other embodiments, the emitter arrays 254A-254C may have other non-linear configurations (e.g., oval, circular, or otherwise round in some fashion) while defining a first dimension (e.g., a width) and a second dimension (e.g. a length) that is orthogonal to the first direction, with one dimension being equal or unequal to each other. The emitters included in emitter arrays 254A-254C may have a 2D emitter array configuration with more than 1000×1000 emitters. In some embodiments, the emitter arrays 254A-254C may be 1D emitter arrays, rather than 2D emitter arrays, as shown in FIG. 4. Various other combinations are also within the scope of the present disclosure. Emitter arrays 254A-254C may be bonded and/or electrically coupled to backplane 348.

Formation of an Image

Figure 5C:
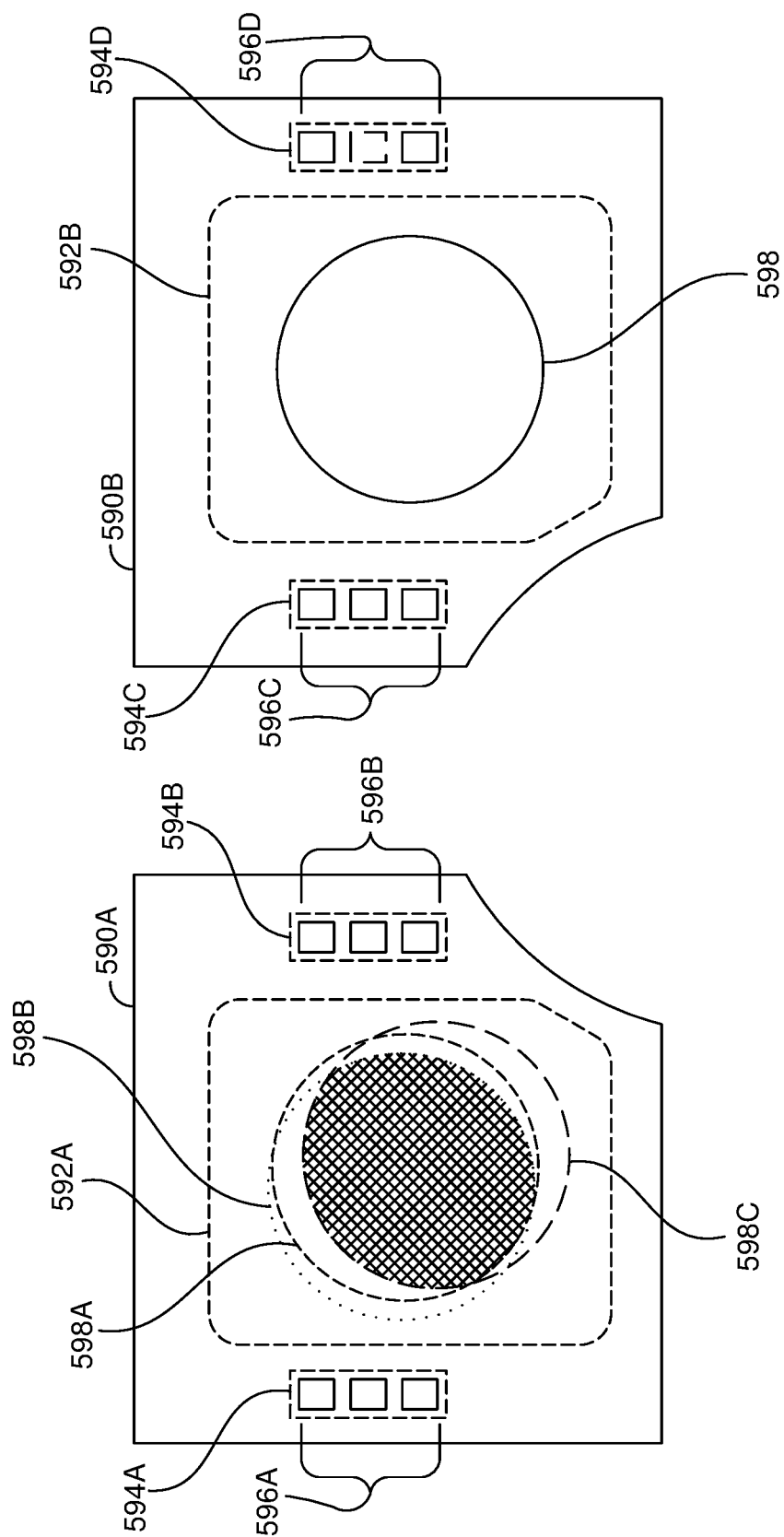
FIG. 5C is a top view of a display device, in accordance with some embodiments.

FIGS. 5A-5C illustrate how images and pupil replications are formed in display device 200 based on different structural arrangement of light emitters, in accordance with different embodiments. An image field 530 of coupling element 238 is an area of coupling element 238 that receives the pre-waveguide image light 208, emitted by the light source 232 and forms an image on the coupling element 238, which is transmitted via waveguide 220. For example, an image field 530 may correspond to a portion of the coupling element 238. Note that decoupling element 214B of FIGS. 2A-2B also includes an image field that outputs the post-waveguide image light 204 to the eye 110 of the user. In some cases, an image field is not an actual physical structure but is an area to which the pre-waveguide or post-waveguide image light is projected and which the image is formed. In one embodiment, the image field is a surface of the coupling element 238 of FIGS. 2A-2B and the image formed on the image field is magnified as light travels through the waveguide 220 of FIGS. 2A-2B. In another embodiment, an image field is formed after light passing through the waveguide which combines the light of different colors to form the image field. In some embodiments, the image field may be projected directly into the user's eyes.

FIG. 5A is a diagram illustrating a scanning operation of a scanning embodiment of display device 200, in accordance with an embodiment. Display device 200 of FIG. 5A may be a scanning embodiment of display device 104 of FIGS. 1A-1B and/or a scanning embodiment of display device 200 of FIGS. 2A-2B, or a scanning embodiment of any other display device discussed herein. As discussed in conjunction with at least FIGS. 2A-2C, display device 200 may include source assembly 230 and a waveguide configuration that includes waveguide 220 and coupling element 238. Coupling element 238 includes an image field 520, of length L2. The image field 520 may include a 2D arrays of pixel locations 532, represented by the blocks in inset 534. The 2D arrays of pixel locations 238 may include p rows, indexed via row 1 through row p. The source assembly 230 includes a light source 232 and a light condition assembly 250. Because display device 200 of FIG. 5A is a scanning display device, the source assembly of FIG. 5A additionally includes a scanning mirror assembly 252, which includes mirror 520, which is a scanning mirror.

As discussed throughout, the light source 232 includes a 1D configuration of emitter arrays (or source elements) 254. That is, light source 232 includes multiple rows and columns of light-emitting components (LECs) that are included in one or more 2D emitter arrays 254. Individual LECs included emitter array 254 are represented by the dots in inset 515. Thus, in some embodiments, emitter arrays may be comprised of one or more arrays of LECs, such as but not limited to light-emitting diodes (LEDs). Various embodiments of emitter arrays are discussed in conjunction with at least FIGS. 3-4. Various non-limiting embodiments of LEDs are discussed in conjunction with at least FIGS. 6A-6B.

In some embodiments, scanning light source 232 may include a 1D configuration of emitter arrays, wherein a separate emitter array 254 of the 1D configuration is dedicated to each primary color of the 2D images to the presented. In various embodiments, the light source 232 may include more than one emitter array 254 for each primary color. Light source 232 may emit source light 244 as a set of collimated beams of light. For example, FIG. 5A shows multiple beams of source light 244 that are emitted by one or more columns of LECs included in emitter array 254. As discussed in conjunction with at least FIGS. 2A-2C, light conditioning assembly 250 may condition source light 244 and transmit resulting conditioned light 248 to scanning mirror assembly 252.

Conditioned light 248 irradiates scanning mirror 520 of scanning mirror assembly 252. The mirror 520 reflects, scans, and projects pre-waveguide image light 208. The mirror 520 may rotate about an axis 522. The mirror 520 may be a microelectromechanical system (MEMS) mirror or any other suitable mirror. As the mirror 520 rotates about rotational axis 522, the pre-waveguide image light 208 is directed to a different part of the image field 530 of coupling element 238, as illustrated by the reflected part of the pre-waveguide image light 208 in solid lines and the reflected part of the pre-waveguide image light 208 in dash lines.

At a particular orientation of the mirror 520 (i.e., a particular rotational angle), the emitter arrays 254 illuminate a portion of the image field 530 (e.g., a particular subset of multiple pixel locations 532 on the image field 530). In one embodiment, the LECs of emitter arrays 254 are arranged and spaced such that a light beam from each emitter array 254 is projected on a corresponding pixel location 532. In another embodiment, small light emitters such as μLEDs are used for emitter arrays 254 so that light beams from a subset of multiple light emitters are together projected at the same pixel location 532. In other words, a subset of multiple emitter arrays 254 collectively illuminates a single pixel location 532 at a time.

The image field 530 may also be referred to as a scan field because, when the pre-waveguide image light 208 is projected to an area of the image field 530, the area of the image field 530 is being illuminated by the pre-waveguide image light 208. The image field 530 may be spatially defined by a matrix of pixel locations 532 (represented by the blocks in inset 534) in rows and columns. A pixel location here refers to a single pixel. The pixel locations 532 (or simply the pixels) in the image field 530 sometimes may not actually be additional physical structure. Instead, the pixel locations 532 may be spatial regions that divide the image field 530. Also, the sizes and locations of the pixel locations 532 may depend on the projection of the pre-waveguide image light 208 from the source assembly 230. For example, at a given angle of rotation of the mirror 520, light beams emitted from the light source 232 may fall on an area of the image field 530. As such, the sizes and locations of pixel locations 532 of the image field 530 may be defined based on the location of each light beam.

In some embodiments, a pixel location 532 may be subdivided spatially into subpixels (not shown). For example, a pixel location 532 may include a red subpixel, a green subpixel, and a blue subpixel. The red subpixel corresponds to a location at which one or more red light beams are projected, etc. When subpixels are present, the color of a pixel 532 is based on the temporal and/or spatial average of the subpixels.

The number of rows and columns of emitter arrays 254 of the light source 232 may or may not be the same as the number of rows and columns of the pixel locations 532 in the image field 530. In various 1D configurations of emitter arrays 254, the number of emitter arrays 254 in a row is equal to the number of pixel locations 532 in a row of the image field 530 while the number of emitter arrays 254 in a column is two or more, but fewer than the number of pixel locations 532 in a column of the image field 530.

In other 1D configurations of emitter arrays 254, the configuration of emitter arrays 254 of light source 232 has the same number of columns of emitter arrays 254 as the number of columns of pixel locations 532 in the image field 530, but has fewer rows than the image field 530. For example, in one specific embodiment, the light source 232 has approximately 1280 columns of emitter arrays 254, which is the same as the number of columns of pixel locations 532 of the image field 530. The light source 232 may have a first length L1, which is measured from the first row to the last row of emitter arrays 254. The image field 530 has a second length L2, which is measured from row 1 to row p of the scan field 530. In one embodiment, L2 is greater than L1 (e.g., L2 is 50 to 10,000 times greater than L1).

As noted, scanning embodiments of display device 200 include a 1D configuration of emitter arrays 254, where the number of rows of pixel locations 532 is larger than the number of rows of emitter arrays 254 in some embodiments, the display device 200 may employ the mirror 520 to project the light 502 to different rows of pixels at different times. As the scanning mirror 520 rotates and the pre-waveguide image light 208 scans through the image field 530 quickly, a scanned image is formed on the image field 530. In some embodiments, the light source 232 may have a smaller number of columns than the image field 530. The mirror 520 may rotate in two dimensions to fill the image field 530 with light (e.g., a raster-type scanning down rows then moving to new columns in the image field 530).

The display device 200 may operate in predefined display periods. A display period may correspond to a duration of time in which an image is formed. For example, a display period may be associated with the frame rate (e.g., a reciprocal of the frame rate). In the particular scanning embodiment shown in FIG. 5A, scanning mirror 520 mirror rotates as a particular rotational frequency, and the display period is as a scanning period that is dependent upon the rotational frequency of mirror 520. A complete cycle of rotation of the mirror 520 may correspond to the scanning period. A scanning period herein refers to a predetermined cycle time during which the entire image field 530 is completely scanned. The scanning of the image field 530 is controlled by the mirror 520.

The light generation of the display device 200 may be synchronized with the rotation of the mirror 520. For example, in one embodiment, the rotational movement of the mirror 520 from an initial position that projects light to row 1 of the image field 530, to the last position that projects light to row p of the image field 530, and then back to the initial position is equal to a scanning period. The scanning period may also be related to the frame rate of the display device 200. By completing a scanning period, an image (e.g., a frame) is formed on the image field 530 per scanning period. Hence, the frame rate may correspond to the number of scanning periods in a second.

As the mirror 520 rotates, light scans through the image field and images are formed. The actual color value and light intensity (brightness) of a given pixel location 532 may be an average of the color various light beams illuminating the pixel location during the scanning period. After completing a scanning period, the mirror 520 rotates back to the initial position to project light onto the first few rows of the image field 530 again, except that a new set of driving signals may be fed to the emitter arrays 254. The same process may be repeated as the scanning mirror 520 rotates in cycles. As such, additional images are formed in the scanning field 530 in different frames.

FIG. 5B illustrates a waveguide configuration 106 of a display device that forms images and replications of images, in accordance with various embodiments. Replications of images may be referred to as pupil replications. Waveguide configuration 106 may be employed in the scanning embodiments, as well as the non-scanning embodiments discussed herein. Waveguide configuration includes light source 232 and waveguide 220. Light source 232 may be included in a source assembly, such as but not limited to source assembly 230 of FIGS. 2B-2C and FIG. 5A. Thus, in scanning embodiments, light source 232 in a scanning light source, and in non-scanning embodiments, light source 232 is a non-scanning light source. As such, the light source 232 may comprise three separate emitter arrays 254, as described in conjunction with at least FIGS. 3-4. The primary colors of emitter arrays 254 may be red, green, and blue, or another combination of other suitable primary colors. The various operations and/or functionalities of waveguide configuration 106 may be controlled via executing instructions on a processor device and/or controller device. When the instructions are executed, the processor device and/or controller device may cause the performance of various actions and/or steps. The instructions may be stored on a non-transitory computer-readable storage medium.

In non-scanning embodiments, the number of light emitters (e.g., individual LECs) in emitter arrays 254 may be equal to the number of pixel locations within an image field (not shown in FIG. 5B). As such, each LEC included in emitter array 254 of a non-scanning embodiment may be dedicated to generating images at a particular pixel location of the image field. In scanning embodiments, the number of light emitters in emitter arrays 254 may be equal may be less than the number of pixel locations within the image field. Thus, in scanning embodiments, each LEC included in emitter array 254 may be dedicated to generating images at multiple pixel locations of the image field. In still other embodiments, scanning and non-scanning configurations may be combined to generate multiple pupil replications.

Thus, the embodiments depicted in FIG. 5B may provide for the projection of many image replications (e.g., pupil replications) or decoupling a single image projection at a single point. Accordingly, additional embodiments of disclosed NEDs may provide for a single decoupling element. Outputting a single image toward the eye-box 108 of FIG. 1B may preserve the intensity of the coupled image light. Some embodiments that provide for decoupling at a single point may further provide for steering of the output image light. Such pupil-steering NEDs may further include systems for eye tracking to monitor a user's gaze. Some embodiments of the waveguide configuration 106 that provide for pupil replication, as described herein, may provide for one-dimensional replication, while other embodiments may provide for two-dimensional replication. For simplicity, FIG. 5B illustrates one-dimensional pupil replication. Two-dimensional pupil replication may include directing light into and outside the plane of FIG. 5B. FIG. 5B is presented in a simplified format. The detected gaze of the user may be used to adjust the position and/or orientation of the emitter arrays 254 individually or the light source 232 as a whole and/or to adjust the position and/or orientation of the waveguide configuration.

The waveguide configuration 106 is disposed in cooperation with a light source (not shown in FIG. 5B), which may include one or more monochromatic or polychromatic emitter arrays 254 secured. Bonded, and/or electrically coupled to a support structure 348 (e.g., a printed circuit board, a backplane, or another structure). The support structure 348 may be coupled to the frame 102 of FIG. 1A. The waveguide configuration 106 may be separated from the light source 232 by an air gap having a distance D1. The distance D1 may be in a range from approximately 50 µm to approximately 500 µm in some examples. The monochromatic or polychromatic images or images projected from the light source 232 (as pre-waveguide image light 208) may pass through the air gap toward the waveguide configuration 106.

Any of the light source embodiments described herein may be utilized as the light source 232.

The waveguide 220 may be formed from a glass or plastic material. The waveguide 220 may include a coupling area 544 (which includes coupling elements 238) and a decoupling area formed by decoupling elements 214A on a top surface 216 and decoupling elements 214B on a bottom surface 218 in some embodiments. The area within the waveguide 220 in between the decoupling elements 214A and 214B may be considered a propagation area 550, in which light images (formed by pre-waveguide image light 208) received from the light source 232 and coupled into the waveguide 220 by coupling elements 238 included in the coupling area 544 may propagate laterally within the waveguide 220.

The coupling area 544 may include coupling elements 238 configured and dimensioned to couple light of a predetermined wavelength, e.g., red, green, or blue light. When a white light emitter array is included in the light source 232, the portion of the white light that falls in the predetermined wavelength may be coupled by each of the coupling elements 238. In some embodiments, the coupling elements 238 may be gratings, such as Bragg gratings, dimensioned to couple a predetermined wavelength of light. In some examples, the gratings of each coupling element 238 may exhibit a separation distance between gratings associated with the predetermined wavelength of light that the particular coupling element 238 is to couple into the waveguide 220, resulting in different grating separation distances for each coupling element 238. Accordingly, each coupling element 238 may couple a limited portion of the white light from the white light emitter array when included. In other examples, the grating separation distance may be the same for each coupling element 238. In some examples, coupling element 238 may be or include a multiplexed coupler.

As shown in FIG. 5B, pre-waveguide image light 208 may include a red image 560A, a blue image 560B, and a green image 560C. The images 560A-560C may be coupled by the coupling elements 238 of the coupling area 544 into the propagation area 550 and may begin traversing laterally within the waveguide 220. In one embodiment, the red image 560A, the blue image 560B, and the green image 560C, each represented by a different dash line in FIG. 5B, may converge to form an overall image that is represented by a solid line. For simplicity, FIG. 5B may show an image by a single arrow, but each arrow may represent an image field where the image is formed. In another embodiment, red image 560A, the blue image 560B, and the green image 560C, may correspond to different spatial locations.

A portion of the light may be projected out of the waveguide 220 (e.g., post-waveguide light 204) after the light contacts the decoupling element 214A for one-dimensional pupil replication, and after the light contacts both the decoupling element 214A and the decoupling element 214B for two-dimensional pupil replication. In two-dimensional pupil replication embodiments, the light may be projected out of the waveguide 220 at locations where the pattern of the decoupling element 214A intersects the pattern of the decoupling element 214B.

The portion of light that is not projected out of the waveguide 220 by the decoupling element 214A may be internally reflected off the decoupling element 214B. The decoupling element 214B may reflect all (or near-all) incident light back toward the decoupling element 214A, as depicted. Accordingly, the waveguide 220 may combine the red image 560A, the blue image 560B, and the green image 560C into a polychromatic image instance, which may be referred to as a pupil replication 562. The polychromatic pupil replication 562 may be projected toward the eye-box 108 of FIG. 1B and to the eye 110, which may interpret the pupil replication 562 as a full-color image (e.g., an image including colors in addition to red, green, and blue). Pupil replication 562 may include at least a portion of the post-waveguide image light 204. The waveguide 220 may produce tens or hundreds of pupil replications 562 or may produce a single replication 562.

In some embodiments, the waveguide configuration 106 may differ from the configuration illustrated in FIG. 5B. For example, the coupling area 544 may be different. Rather than including gratings as coupling element 238, an alternate embodiment may include a prism that reflects and refracts received image light, directing it toward the decoupling element 214A. Also, while FIG. 5B generally shows the light source 232 having multiple emitter arrays 254 coupled to the same support structure 348, other embodiments may employ a light source 232 with separate monochromatic emitter arrays 254 located at disparate locations about the waveguide configuration (e.g., one or more emitter arrays 254 located near a top surface of the waveguide configuration and one or more emitter arrays 254 located near a bottom surface of the waveguide configuration).

Also, although only three emitter arrays are shown in FIG. 5B (e.g., a scanning 1D configuration of emitter arrays), an embodiment may include more or fewer emitter arrays. For example, in one embodiment, a display device may include two red emitter arrays, two green emitter arrays, and two blue emitter arrays (e.g., a non-scanning 2D configuration of emitter arrays). In one case, the extra set of emitter panels provides redundant light emitters for the same pixel location. In another case, one set of red, green, and blue panels is responsible for generating light corresponding to the most significant bits of a color dataset for a pixel location while another set of panels is responsible for generating light corresponding the least significant bits of the color dataset.

FIG. 5C is a top view of a display system (e.g., an NED), in accordance with an embodiment. The NED may include a pair of waveguide configurations. The included waveguide configuration may be an embodiment of, or at least similar to, at least one of waveguide configuration 106 of FIG. 1B, the waveguide configuration of FIG. 2A, and/or waveguide configuration 106 of FIG. 5B. Each waveguide configuration projects images to an eye of a user. In some embodiments not shown in FIG. 5C, a single waveguide configuration that is sufficiently wide to project images to both eyes may be used.

The waveguide configurations 590A and 590B may each include a decoupling area 592A or 592B. In order to provide images to an eye of the user through the waveguide configuration 590, multiple coupling areas 594 may be provided in a top surface of the waveguide of the waveguide configuration 590. The coupling areas 594A and 594B may include multiple coupling elements to interface with light images provided by an emitter array set 596A and an emitter array set 596B, respectively. Each of the emitter array sets 596 may include a plurality of monochromatic light emitter arrays, as described herein. As shown, the emitter array sets 596 may each include a red emitter array, a green emitter array, and a blue emitter array. As described herein, some emitter array sets may further include a white emitter array or a emitter array emitting some other color or combination of colors.

The right eye waveguide 590A may include one or more coupling areas 594A, 594B, 594C, and 594D (all or a portion of which may be referred to collectively as coupling areas 594) and a corresponding number of emitter array sets 596A, 596B, 596C, and 596D (all or a portion of which may be referred to collectively as the light emitter array sets 596). Accordingly, while the depicted embodiment of the right eye waveguide 590A may include two coupling areas 594 and two emitter array sets 596, other embodiments may include more or fewer. In some embodiments, the individual emitter arrays of an emitter array set may be disposed at different locations around a decoupling area. For example, the emitter array set 596A may include a red emitter array disposed along a left side of the decoupling area 592A, a green emitter array disposed along the top side of the decoupling area 592A, and a blue emitter array disposed along the right side of the decoupling area 592A. Accordingly, emitter arrays of an emitter array set may be disposed all together, in pairs, or individually, relative to a decoupling area.

The left eye waveguide 590B may include the same number and configuration of coupling areas 594 and LED sets 596 as the right eye waveguide 590A, in some embodiments. In other embodiments, the left eye waveguide 590B and the right eye waveguide 590A may include different numbers and configurations (e.g., positions and orientations) of coupling areas 594 and emitter array sets 596. Included in the depiction of the left waveguide 590A and the right waveguide 590B are different possible arrangements of pupil replication areas of the individual emitter arrays included in one emitter array set 596. In one embodiment, the pupil replication areas formed from different color emitter arrays may occupy different areas, as shown in the left waveguide 590A. For example, a red emitter array of the emitter array set 596 may produce pupil replications of a red image within the limited area 598A. A green emitter array may produce pupil replications of a green image within the limited area 598B. A blue emitter array may produce pupil replications of a blue image within the limited area 598C. Because the limited areas 598 may be different from one monochromatic emitter array to another, only the overlapping portions of the limited areas 598 may be able to provide full-color pupil replication, projected toward the eye-box 108. In another embodiment, the pupil replication areas formed from different color emitter arrays may occupy the same space, as represented by a single solid-lined circle 598 in the right waveguide 590B.

In one embodiment, waveguide portions 590A and 590B may be connected by a bridge waveguide (not shown). The bridge waveguide may permit light from the emitter array set 596A to propagate from the waveguide portion 590A into the waveguide portion 590B. Similarly, the bridge waveguide may permit light emitted from the emitter array set 596B to propagate from the waveguide portion 590B into the waveguide portion 590A. In some embodiments, the bridge waveguide portion may not include any decoupling elements, such that all light totally internally reflects within the waveguide portion. In other embodiments, the bridge waveguide portion 590C may include a decoupling area. In some embodiments, the bridge waveguide may be used to obtain light from both waveguide portions 590A and 590B and couple the obtained light to a detection (e.g. a photodetector), such as to detect image misalignment between the waveguide portions 590A and 590B.

Structure of a Light-Emitting Diode (LED)

Figure 6A:
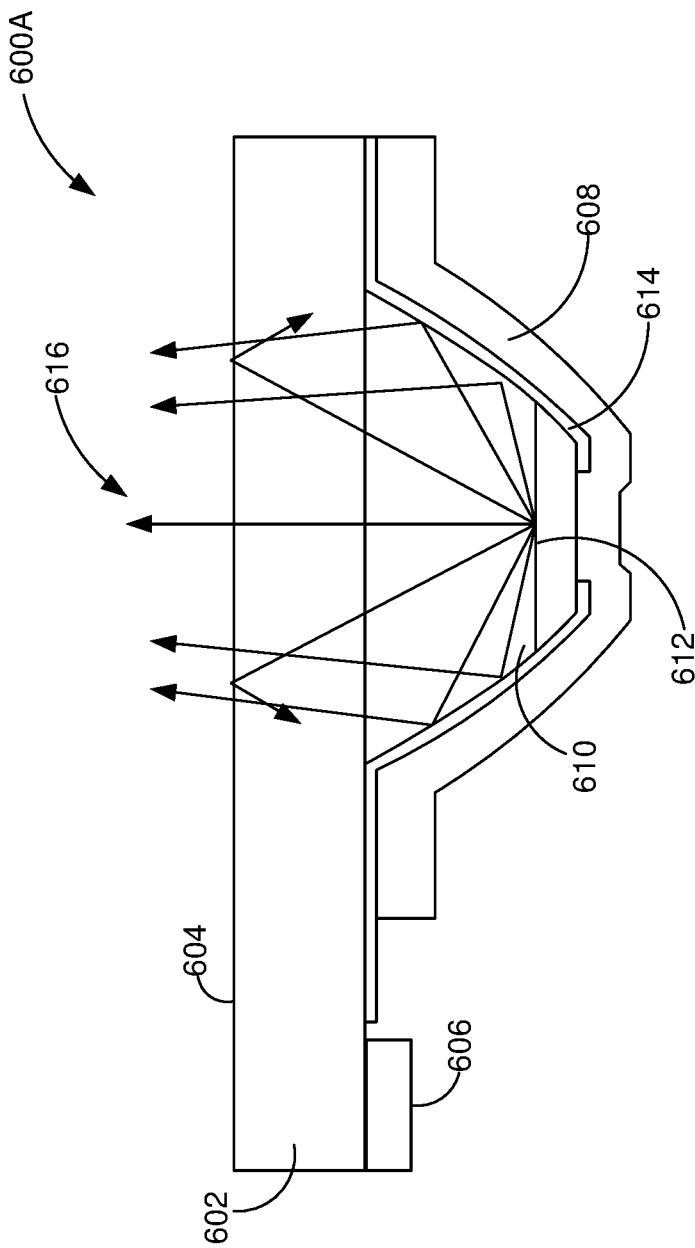
FIG. 6A is a cross-sectional diagram illustrating an embodiment of an LED, in accordance with one embodiment.

FIG. 6A is a cross-sectional diagram illustrating an LED 600A, in accordance with one embodiment. LED 600A may be a light-emitting component (LEC) included in any of the emitter arrays discussed herein. As such, LED 600A may be included in a head-mounted device (HMD), such as but not limited to HMD 100 of FIGS. 1A-1B. LED 600A may be an LED die. In various embodiments, LED 600A is a micro-LED (μLED), where the feature sizes are on the order of a few microns (μm) to hundreds of microns. In at least some embodiments, the feature size of LED 600A may be less than a micron (i.e., the feature size may be sub-micron). LED 600A is an example of an LED that may be positioned on and bonded to a surface of a display substrate (e.g., backplane 348 of FIGS. 3-4 or the target substrate 832 shown in FIGS. 8A-8B) to emit visible or invisible light. The target substrate may be a backplane for a display device, such as but not limited to backplane 348 of FIGS. 3-4.

In some embodiments, LED 600A is formed on a substrate layer (not shown in FIG. 6A), or semiconductor wafer, and includes, among other components a semiconductor layer 602, a dielectric layer 614 disposed on the semiconductor layer 602, a p-contact 608 disposed on a first portion of the dielectric layer 614, and an n-contact 606 disposed on a second portion of the semiconductor layer 602. The semiconductor layer 602 may be formed on a substrate layer, such as but not limited to a gallium substrate layer. Thus, semiconductor layer 602 may be a gallium (Ga) semiconductor layer. Note that semiconductor layer 602 may be formed of other semiconductor lattices or materials, such as gallium nitride (GaN), gallium phosphide (GaP), gallium arsenide (GaAS), or any other semiconductor material appropriate for the fabrication of an LED. Note that this discussion of LED 600A is non-limiting, and LED 600A may be formed via other semiconductor lattices other than gallium-based lattices. In some embodiments, the semiconductor layer 602 is formed on the substrate layer as an epitaxial layer.

The p-contact 608 and the n-contact 606 are the electrical contacts coupled to the p-type and n-type regions of LED 600A, respectively. That is, p-contact 608 may be employed to electrically couple the p-type region of LED 600A to other semiconductor devices, such as but not limited to a target substrate. Likewise, n-contact 606 may be employed to electrically couple the n-type region of LED 600A to other semiconductor devices. For example, p-contact 608 and n-contact 606 may be bonded to corresponding electrical contacts of a backplane to bond LED 600A to the backplane. P-contact 608 and n-contact 606 may singly, or collectively, be referred to as electrical contacts, electrical interconnects, electrical leads, or contact pads of LED 600A. In some embodiments, p-contact 608 and n-contact 606 may include metal bumps. In some non-limiting embodiments, p-contact 608 and n-contact 606 may be comprised of a copper-tin (CuSn) alloy.

LED 600A may be less than 100 microns in diameter with a parabolic structure etched onto the LED die during wafer processing to form a quasi-collimated light beam emerging from the light-emitting face 604. In at least one embodiment, LED 600A may be less than 100 microns in diameter. LED 600A may include highlight extraction efficiency and outputs quasi-collimated light because of its shape. As shown in FIG. 6A, semiconductor layer 602 may be shaped into a mesa-structure 610. An active (or light emitting) layer 612 (or 'active light-emitting area") is included in the mesa-structure 610. The active layer 612 may correspond to the region of the band gap of LED 600A. A voltage difference applied across the p-contact 608 and the n-contact 606 may result in the active layer 612 emitting visible or invisible photons (i.e., light). The mesa 610 has a truncated top, on a side opposed to the light-emitting face 604. The mesa 610 also has a curved or near parabolic shape to form a reflective enclosure for light within LED 600A. The arrows 616 show how light emitted from the active layer 612 is reflected off the walls of the mesa 610 toward the light-emitting face 604 at an angle sufficient for the light to escape the LED 600A (e.g., within the angle of total internal reflection).

The structure of LED 600A results in an increase in the efficiency of light emission when compared to unshaped or conventional LED chips. As such, the LED 600A produces light visible to the human eye with reduced current (e.g., nano-amps of drive current). LED 600A is an example of an LED die, although other types of LED dies may be assembled onto a backplane for a display, as discussed herein.

Figure 6B:
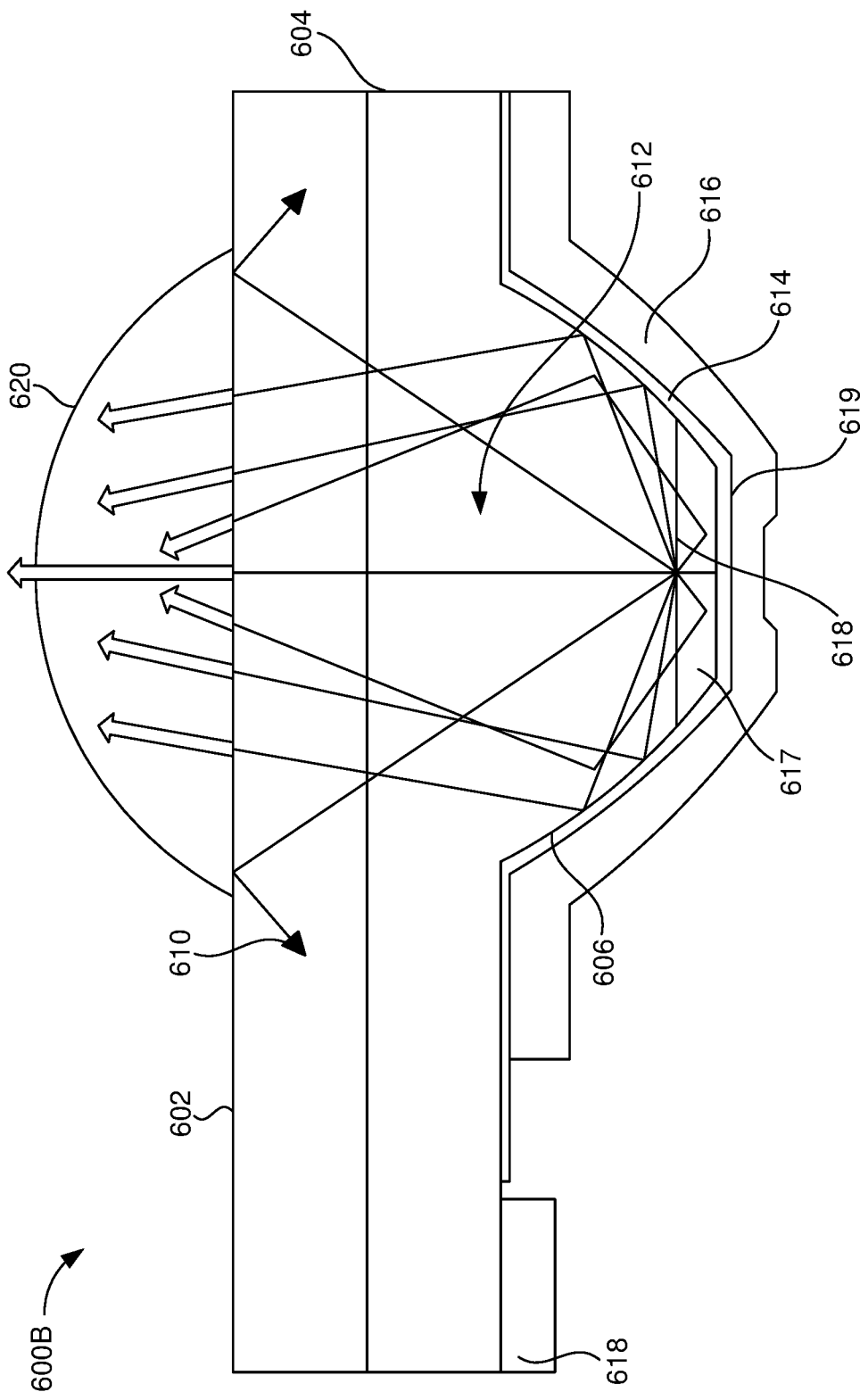
FIG. 6B is a cross-sectional diagram illustrating another embodiment of an LED, in accordance with one embodiment.

FIG. 6B depicts a μLED 600B that is similar in many respects to the μLED 600A of FIG. 6A. The μLED 600B may further include a μlens 620, which may be formed over the parabolic structure. In some embodiments, the μlens 620 may be formed by applying a polymer coating over the μLED 600A, patterning the coating, and reflowing the coating to achieve the desired lens curvature. The μlens 620 may be disposed over an emissive surface to alter a chief ray angle of the μLED 600B. In another embodiment, the μlens 620 may be formed by depositing a μlens material above the μLED 600A (for example, by a spin-on method or a deposition process). For example, a μlens template (not shown) having a curved upper surface can be patterned above the μlens material. In some embodiments, the μlens template may include a photoresist material exposed using a distributing exposing light dose (e.g., for a negative photoresist, more light is exposed at a bottom of the curvature and less light is exposed at a top of the curvature), developed, and baked to form a rounding shape. The μlens 620 can then be formed by selectively etching the μlens material according to the μlens template. In some embodiments, the shape of the μlens 620 may be formed by etching into the substrate 602. In other embodiments, other types of light-shaping or light-distributing elements, such as an annular lens, Fresnel lens, or photonic crystal structures, may be used instead of μlenses.

In some embodiments, μLED arrangements other than those specifically discussed above in conjunction with FIGS. 6A and 6B may be employed as a μLED in any of the various embodiments of emitter arrays discussed herein. For example, the μLED may include isolated pillars of epitaxially grown light-emitting material surrounded by a metal reflector. The pixels of an emitter array may also include clusters of small pillars (e.g., nanowires) of epitaxially grown material that may or may not be surrounded by reflecting material or absorbing material to prevent optical crosstalk.

In some examples, the μLED pixels may be individual metal p-contacts on a planar, epitaxially grown LED device, in which the individual pixels may be electrically isolated using passivation means, such as plasma treatment, ion-implantation, or the like. Such devices may be fabricated with light extraction enhancement methods, such as μlenses, diffractive structures, or photonic crystals. Other processes for fabricating the μLEDs of the dimensions noted above other than those specifically disclosed herein may be employed in other embodiments.

Fabricating Parabolic-Shaped LEDS

As described, embodiments herein, provide enhanced methods and systems to fabricated micro light-emitting diodes with tightly controlled parabolic shapes. FIG. 7A is a diagram illustrating a mask 720 formed on a top surface 712 of a semiconductor substrate 702, in accordance with one embodiment. FIG. 7B is a diagram illustrating an etching process that removes a portion of the mask 720 of FIG. 7A, in accordance with one embodiment. FIG. 7C is a diagram illustrating a semiconductor device 760 fabricated from the semiconductor substrate 702, wherein the remaining portion of the mask 720 has been removed via a photoresist-stripping process. Taken together, FIGS. 7A-7C demonstrate the fabrication of a micro light-emitting diode (µLED), via the enhanced embodiments discussed herein. FIG. 7A shows a mask 720 formed on a top surface 712 of a semiconductor substrate 702 (e.g., a semiconductor wafer). The mask may be a photomask. The mask 702 includes a boss 740 and a protrusion 730 that extends beyond an upper portion of the boss 740. In various non-limiting embodiments, the protrusion 730 is a cylindrical protrusion. The substrate 702 may include a bulk layer 710, a buffer plus doped layer 708, an active layer 706, and a dope layer 704.

The shape of the boss 740 includes a truncated conic section solid of revolution. In various embodiments, the conic section may be a parabola. In other embodiments, the boss may take on shapes other than a truncated conic section solid of revolution. It should be understood that the shape of the boss is not limited to a parabolic-shaped boss. The shape of the parabolic boss 740 may be characterized by a lower diameter 742, an upper diameter 744, and a boss height 746. As shown in FIG. 7A, the lower diameter 742 of the boss 740 may be greater than the upper diameter 744 of the boss 740. More specifically, the boss 740 may include two lateral surfaces (an upper and a lower lateral surface not visible from the view of FIG. 7A) and a longitudinal surface 748 connecting the upper and lower surfaces. The shape of the cylindrical protrusion 730 may be characterized by a cylinder diameter 732 and a cylinder height 736. The cylindrical protrusion 730 may include two circular lateral surfaces (e.g., an upper endcap and a lower endcap also not visible from the view of FIG. 7A) characterized by the cylinder diameter 732. The cylindrical protrusion 730 may also include a longitudinal surface 738 connecting the upper and lower endcaps, which are separated by the cylinder height. In at least some embodiments, the upper diameter 744 of the boss 740 may be substantially similar to the cylinder diameter 732 of the cylindrical protrusion 730. In embodiments, the protrusion 730 may take a shape other than a cylindrical shape.

The upper surface of the boss 740 may be a substantially planar circular surface with a diameter substantially equivalent to the upper diameter 744 of the boss 740. The lower surface of the boss 740 may be a substantially planar circular surface with a diameter substantially equivalent to the lower diameter 742 of the boss 740. In other embodiments, the upper and/or lower surfaces of the boss 740 may be elliptical surfaces. The upper and/or lower surfaces of the boss 740 may take on other shapes or cross sections, such as square, rectangular, or any other shape. The upper surface and the lower surface of the boss may be substantially parallel surfaces separated by the boss height 746. The contour of the boss may be such that the boss' longitudinal surface 748, which connects the upper and lower surfaces of the boss 740, is substantially similar to a conic section solid of revolution. The longitudinal surface 748 of the boss 740 may be a non-planar surface. In a non-limiting embodiment, the conic section may be a parabola. The axis of revolution of the conic section solid of revolution may be orthogonal to the planes of the upper and lower surfaces of the boss 740.

When formed on the substrate 702, each of the planar upper and lower surfaces of the boss 740 may be substantially parallel with the upper surface 712 of the substrate 702. The lower surface of the boss may be proximate to and positioned on top off the upper surface 712 of the substrate 702, such that the upper surface of the boss is positioned above (and offset by the boss height 746 from) the upper surface 712 of the substrate 702. The lower endcap of the cylindrical protrusion 730 may be adjacent to and positioned on top of the upper surface of the boss 740. Because the cylinder diameter 732 and the upper diameter 744 of the boss 740 may be substantially similar diameters, and because both are circular surfaces, the perimeters and surface area of the lower endcap of the protrusion 730 and the upper surface of the boss 740 may be similar. Furthermore, the axis of rotation of the boss 740 and the axis of rotation of the protrusion 730 may be substantially aligned. Accordingly, the boss 740 and the protrusion 730 may share a common axis of rotation (i.e., an axis of symmetry). The lower endcap of the cylindrical protrusion 730 may be offset from the upper surface 712 of the substrate by a height substantially equal to the height 746 of the boss 740. The upper endcap of the cylindrical protrusion 730 may be offset from the upper surface 712 of the substrate 702 by a height substantially equal to the sum of the height 746 of the boss 740 and the cylinder height 736.

The mask, including the boss 740 and the cylindrical protrusion 730, may be comprised of a photoresist material. Even though photoresist material may be utilized to form mask 720, the mask 720 is not formed by a photoresist process. Rather, the mask 720, including the boss 740 and the cylindrical protrusion 730 may be formed via a three-dimensional (3D) patterning and/or machining method. Such 3D patterning and/or machining methods include, but are not limited to multi-photon lithography (e.g., 2-photon lithography), micro- or nano-indentation, nano-imprinting, electron beam (e-beam) lithography, ion-beam lithography, micro- or nano-imprint lithography, grayscale lithograph, focused ion beam writing, and the like. Virtually and micro- or nano-technique for 3D patterning may be employed in the various embodiments. In at least some of these embodiments, at least portions of the mask need not be photo-sensitive, so that virtually any polymer that is compatible with the full process flow may be employed to generate the mask. In particular, the mask is not formed by a photoresist reflow process.

In FIG. 7B, a structure of a semiconductor device (e.g., a µLED 760) is being shaped by an etching process. More particularly, the etching process may transfer the contour of the boss 740 of FIG. 7A to the structure of the µLED 760. The etching process may be a dry etching process that employs flowing particles 750 (as indicated by the arrows). The flowing particles 750 may remove (or etch away) the boss 740, a portion of the cylindrical protrusion 730, and a portion of the semiconductor substrate 702 that is uncovered by the removal of the boss 740, such that the structure of the µLED 760 is substantially similar to the shape of the boss 740.

A portion of the cylindrical protrusion 730 remains on a top surface of parabolic-shaped µLED 760. The remaining portion of the cylindrical protrusion 730 includes a reduced height, but the diameter 732 of the cylindrical protrusion 730 is conserved. Note that the shape of µLED 760 has been etched out of and includes the buffer plus doped layer 708 of the substrate 702, the active layer 706 of the substrate 702, and the doped layer 704 of the substrate 702.

As shown in FIGS. 7A-7B, the cylindrical protrusion 730 may be configured and arranged on the upper portion of the boss, such that the direction of particle flow (shown by the vertical arrows in FIG. 7B) in the etching process is substantially aligned with the axis of rotation of the cylindrical protrusion 730, as well as the axis of rotation of the boss 740. That is, the direction of the particle flow of the etching process is orthogonal to the planes of the protrusion's 730 endcaps (and the planes of the lower and upper surfaces of the boss 740). As also noted above, the lower endcap of the cylindrical protrusion 730 may be proximate to, aligned with, and positioned on top of the upper surface of the boss 740. The etching process that removes the boss 740 and portions of the substrate 702 may also remove at least a portion of the protrusion 730. However, because the direction of particle flow of the etching is substantially aligned with the axis of the cylindrical protrusion 730 (and axis of the boss 740), the height 736 of the cylindrical protrusion 730 is reduced during the etching, while the diameter 732 of the protrusion 730 (which substantially matches the upper diameter 744 of the boss 740, and hence the upper diameter of the μLED 760) is conserved during etching. That is, the lateral cross section of the protrusion 730 remains approximately constant during the etching process. Thus, as shown in FIG. 7B, after the etching process, a portion of the cylindrical protrusion 730 (with a reduced height 736 but conserved diameter 732) may remain on the upper surface of the μLED 760. Because only the height 736 (and not the diameter 732) of the cylindrical protrusion 730 is reduced during etching and the diameter 732 of the protrusion 730 is approximately equivalent to the upper diameter 744 of the μLED 760 (and as shown in FIG. 7B), the etching process may continue after the boss 740 is completely removed from the substrate 702, without effecting the shape of the μLED 760, until the cylindrical protrusion 730 is completely removed from the substrate 702. Thus, the cylindrical protrusion 730 provides a temporal buffer for the etching process, and enables over-etching of the mask 720, without significantly affecting the parabolic shape of the fabricated μLED 760. More specifically, the parabolic shape of the μLED 760 is not significantly affect as long as the μLED 760 is not strongly over-etched. As such, the parabolic shape of the μLED 760 is tightly controlled and highly uniform, across the substrate 702. In various embodiments, the etching process is continued long enough to completely remove boss 740 from the substrate 702, but is terminated prior to the complete removal of the cylindrical protrusion 730.

The shape of the structure of the μLED 760 may be parabolic. In some embodiments, the parabolic shape of the μLED 760 acts to form a focal plane within the active layer 706 of the μLED 760. That is, the focal plane of parabolic-shaped μLED 760 may be positioned within the active layer 706 of the μLED 760. With the focal plane positioned within the active layer 706, the beam of photons transmitted by the μLED is sufficiently focused such that photons emerge from the light-emitting surfaces of the μLED within a relatively small solid angle, which provides a significant enhancement to the luminance of the μLED 760. By precisely-controlling the shape of the μLED to be parabolic and highly uniform (via 3D patterning and/or machining of mask 720), the beam of light transmitted by the photons is sufficiently collimated to significantly increase the luminance of the μLED 760. As discussed throughout, by forming the mask via 3D patterning and/or machining methods, as opposed to a photoresist reflow process, the shape and uniformity of the mask 720 (and thus the fabricated μLED 760) are tightly controlled and highly uniform.

In FIG. 7C, a photoresist-stripping process has been employed to facilitate the removal of the remaining portion of the cylindrical protrusion 730. The removal of the remaining portion of the cylindrical protrusion 730 exposes the top surface 714 of parabolic-shaped μLED 760. Because the shape of the boss 740 is transferred to the μLED 760, the μLED 760 may include structures, surfaces, and physical dimensions that are analogous to the boss 740. For example, the μLED 760 may include a circular upper lateral surface (not visible in the view of FIG. 7C) with an upper diameter 764 substantially equivalent to the boss' upper diameter 744, a circular lower lateral surface with a lower diameter 762 substantially equivalent to the boss' lower diameter 742, a longitudinal surface 768 separating the parallel lower and upper lateral surfaces by an offset of a height 766 that is substantially equivalent to the boss' height 746, and an axis of rotation substantially orthogonal to the parallel upper and lower surfaces. That is, at least because of the inclusion of the cylindrical protrusion 730 on the mask, the size and/or shape of at least portions of the μLED 760 (e.g., the upper lateral surface 764 or the truncated upper surface) may be kept at least almost constant, even if the μLED 760 is over-etched. Keeping the upper lateral surface 764 of nearly or almost constant cross-section, may enable uniformity of the electrical contacts across the substrate or the wafer, when electrical contacts are added to the top surface 764. Thus, as discussed herein, the lower diameter 762 of the μLED 760 may be substantially equivalent and/or similar to the lower diameter 742 of the boss 740, the upper diameter 764 of the μLED 760 may be substantially equivalent and/or similar to the upper diameter 744 of the boss 740, and the height 766 of the LEC may be substantially equivalent and/or similar to the height 746 of the boss 740. Because the shape of the boss 740 is precisely transferred to the μLED 760 during the etching process, the shape of the fabricated μLED 760 may also be a conic section solid of revolution.

FIG. 8A is a diagram illustrating a top view of a mask, including a plurality of bosses and cylindrical protrusions, formed on a top surface 812 of a semiconductor substrate 802, to fabricate a plurality of light-emitting diodes (LEDs), in accordance with one embodiment. As discussed throughout, the fabricated LEDs may be μLEDs. FIG. 8B is a diagram illustrating a tilted view of a mask and semiconductor substrate of FIG. 8A. By showing the mask and substrate 802 in a titled view, FIG. 8B illustrates some 3D details that may not be apparent in the top view of FIG. 8A.

For each μLED to be fabricated from the semiconductor substrate 802, the mask includes a portion, which includes a boss and a cylindrical protrusion that extends beyond and upper portion of the boss. One such mask portion 820 is identified in FIG. 8A. Mask portion 820 includes boss 840 and the corresponding cylindrical protrusion 830. The upper endcap 834 of cylindrical protrusion 830 is shown in FIGS. 8A-8B. FIG. 8C is a diagram illustrating the plurality of light-emitting diodes fabricated from the mask and semiconductor substrate 802 of FIGS. 8A-8B. One such LED is indicated as μLED 860 in FIG. 8C. μLED 860 may be fabricated via the etching and photoresist-stripping processes applied to mask portion 820, as discussed thought out. As shown in FIG. 8C, an electrical contact 868 has been affixed to an upper layer 866 of μLED 860.

Generalized Processes for Fabricating Parabolic-Shaped Semiconductor Devices

Figure 9:
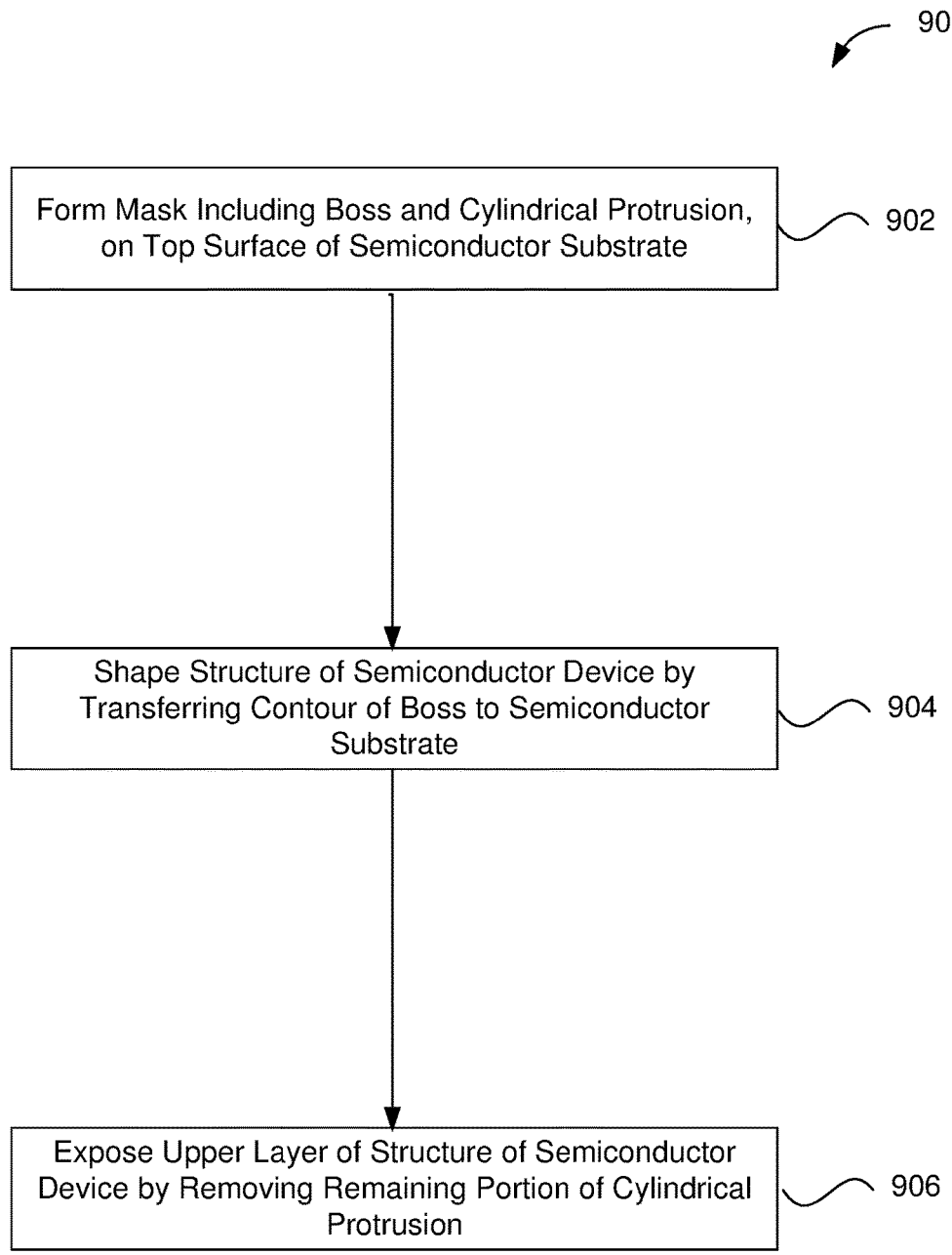
FIG. 9 illustrates one embodiment of an enhanced process flow for fabricating semiconductor devices, consistent with the various embodiments.

FIG. 9 illustrates one embodiment of an enhanced process flow for fabricating semiconductor devices. The semiconductor devices fabricated via process 900 may include a shape that is substantially similar to a conic section solid of revolution. In some non-limiting embodiments, the conic section may be a parabola. In some non-limiting embodiments, the fabricated semiconductor device may be a light-emitting component (LEC), such as but not limited to a light-emitting diode (LED). In at least one embodiment, the LED may be a micro-LED (μLED). In other embodiments, the semiconductor device need not be a light-emitting device. For example, the semiconductor device may include a transistor, a non light-emitting diode, a resistive element, a capacitor, a microelectricalmechanical (MEMs) device, and the like. In some embodiments, the semiconductor device may include a logic device (e.g., a processors and/or an array of logic gates), a memory device (e.g., a SRAM, DRAM, and/or EEPROM), or any other integrated circuit (IC) device.

In embodiments that fabricate μLEDs, the μLEDs may be included in any of the embodiments of head-mounted devices (HMDs) and/or near-eye display (NEDs) discussed herein. For example, a fabricated μLED may be included in a virtual-reality (VR) device, an augmented-reality (AR) device, and/or a mixed-reality (MR) device. A system that includes a first particle source, a second particle source, and a third particle source may implement and/or carry out at least portions of process 900. The various operations, blocks, actions, and/or steps of process 900 may be implemented via executing instructions on a processor device and/or controller device. When the instructions are executed, the processor device and/or controller device may cause the performance the various operations, blocks, actions, and/or steps of process 900. The instructions may be stored on a non-transitory computer-readable storage medium and/or media.

As used herein, computer-readable storage media and/or medium can be any available media that can be accessed by a computing device and includes both volatile and nonvolatile media, and removable and non-removable media. By way of example, and not limitation, computer-readable media may comprise computer storage media and communication media. Computer storage media includes both volatile and nonvolatile, removable and non-removable media implemented in any method or technology for storage of information such as computer-readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by a computing device. Non-transitory computer-readable storage media does not comprise signals per se. Communication media typically embodies computer-readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of any of the above should also be included within the scope of computer-readable media.

Process 900 begins at block 902, where a mask is formed on a top surface of a semiconductor substrate (e.g., a semiconductor wafer). The mask may include a boss and a protrusion that extends beyond an upper portion of the boss. The protrusion may be a cylindrical protrusion. The mask may be formed via a 3D patterning and/or machining process, such as but not limited to multi-photon lithography (e.g., 2-photon lithography), nano-indentation, electron beam (e-beam) lithography, ion-beam lithography nanoimprint lithography, grayscale lithograph, focused ion beam writing, and the like. A first particle source may be utilized to form the mask. The first particle source may be photon source (e.g., for 2-photon lithography embodiments), an electron beam (e.g., for e-beam embodiments), and/or an ion beam (for ion-beam embodiments).

The shape of the boss may include a conic section solid of revolution. The conic section may be a parabola. Thus, the shape of the boss may include and/or be characterized by a lower diameter of a lower portion of the boss and an upper diameter of an upper portion of the boss, such that the shape of the boss is a truncated-conic shape. The shape of the cylindrical protrusion includes the upper diameter of the upper portion of the boss and a cylinder height.

At block 904, a structure of the semiconductor device is shaped by transferring a contour (or shape) of the boss to the semiconductor device. The contour of the boss may be transferred to the semiconductor device via an etching process that removes the boss, a portion of the cylindrical protrusion, and a portion of semiconductor substrate that is uncovered by the removal of the boss. By transferring the shape of the boss to the semiconductor device, the structure of the semiconductor device may be substantially similar to the shape of the boss.

An etching process may be used to facilitate the removal of the boss, the portion of the cylindrical protrusion, and the portions of the semiconductor substrate that are uncovered by the removal of the boss. The etching process may be a dry etching process. Thus, a second particle source may be utilized to transfer a contour of the boss to the semiconductor device. The second particle source may be a source of energetic ions.

In embodiments where the shape of the boss includes a parabolic shape, the shape of the structure of the semiconductor device may form a focal plane within an active layer of the semiconductor substrate and/or semiconductor device. Because a parabolic contour of the boss is transferred to the structure of the semiconductor device, an upper portion of the structure of the semiconductor device may include an upper diameter, a lower portion of the structure of the semiconductor device may include a lower diameter, and a distance between the upper and lower portions may be proportional to a difference in a square of a lower diameter and a square of a upper diameter. That is the shape of the structure of the semiconductor device and/or the shape of the boss is substantially similar to a truncated paraboloid.

As discussed throughout, the cylindrical protrusion may provide for a temporal buffer that allows for over-etching of the substrate, without significantly effecting the shape of the semiconductor device. Thus, a variance in an amount of time associated with the shaping of the structure of the semiconductor device may be based on a height of the cylindrical protrusion.

At block 906, an upper layer of the structure of the semiconductor device is exposed by removing a remaining portion of the cylindrical protrusion. A photoresist stripping process may be used to facilitate the removal of the remaining portion of the cylindrical protrusion. Thus, a third particle source may be employed to expose the upper layer of the structure of the semiconductor device. The third particle source may include a source of photons. In at least one embodiment, an electrical contact may be affixed to the upper layer of the structure of the semiconductor device. In other embodiments, an oxygen ($O_2$) plasma may be employed to remove any remaining portion of the cylindrical protrusion.

From the foregoing, it will be seen that this invention is one well adapted to attain all the ends and objects set forth above, together with other advantages which are obvious and inherent to the system and method. It will be understood that certain features and subcombinations are of utility and may be employed without reference to other features and subcombinations. This is contemplated by and is within the scope of the claims.

The subject matter of the present invention is described with specificity herein to meet statutory requirements. However, the description itself is not intended to limit the scope of this patent. Rather, the inventors have contemplated that the claimed subject matter might also be embodied in other ways, to include different steps or combinations of steps similar to the ones described in this document, in conjunction with other present or future technologies. Moreover, although the terms "step" and/or "block" may be used herein to connote different elements of methods employed, the terms should not be interpreted as implying any particular order among or between various steps herein disclosed unless and except when the order of individual steps is explicitly described.

What is claimed is:

1. A method for fabricating a semiconductor device from a semiconductor substrate, the method comprising:
    forming a mask on a top surface of the semiconductor substrate, wherein the mask includes a boss and a cylindrical protrusion that extends beyond an upper portion of the boss;
    shaping a structure of the semiconductor device by transferring a contour of the boss to the semiconductor substrate, via a removal of the boss, a portion of the cylindrical protrusion, and portions of the semiconductor substrate that are uncovered by the removal of the boss, such that a shape of the structure of the semiconductor device is substantially similar to a shape of the boss; and
    exposing an upper layer of the structure of the semiconductor device by a removal of a remaining portion of the cylindrical protrusion.

2. The method of claim 1, wherein the shape of the boss includes a parabolic shape such that the shape of the structure of the semiconductor device forms a focal plane within an active layer of the semiconductor substrate.

3. The method of claim 1, further comprising:
    using a multi-photon lithography process to form the mask on the top surface of the semiconductor substrate.

4. The method of claim 1, further comprising:
    using a dry-etching process to facilitate the removal of the boss, the portion of the cylindrical protrusion, and the portions of the semiconductor substrate that are uncovered by the removal of the boss.

5. The method of claim 1, wherein the semiconductor device is a light-emitting diode (LED).

6. The method of claim 1, further comprising:
    using a photoresist-stripping process to facilitate the removal of the remaining portion of the cylindrical protrusion.

7. The method of claim 1, further comprising:
    using one of an ion-beam lithography process or an electron-beam lithography process to form the mask on the top surface of the semiconductor substrate.

8. A system for fabricating a semiconductor device from a semiconductor substrate, the system comprising:
    a first particle source that forms a mask on a top surface of the semiconductor substrate, wherein the mask includes a boss and a cylindrical protrusion that extends beyond an upper portion of the boss;
    a second particle source that shapes a structure of the semiconductor device by transferring a contour of the boss to the semiconductor substrate, via a removal of the boss, a portion of the cylindrical protrusion, and portions of the semiconductor substrate that are uncovered by the removal of the boss, such that a shape of the structure of the semiconductor device is substantially similar to a shape of the boss; and
    a third particle source that exposes an upper layer of the structure of the semiconductor device by a removal of a remaining portion of the cylindrical protrusion.

9. The system of claim 8, wherein the shape of the boss comprises a lower diameter of a lower portion of the boss and an upper diameter of the upper portion of the boss such that the shape of the boss is a truncated-conic shape.

10. The system of claim 9, wherein a shape of the cylindrical protrusion comprises the upper diameter of the upper portion of the boss and a cylinder height.

11. The system of claim 8, wherein the first particle source comprises an electron beam or an ion beam.

12. The system of claim 8, wherein the first particle source comprises a photon beam.

13. The system of claim 8, wherein the second particle source comprises a source of energetic ions.

14. The system of claim 8, wherein the third particle source comprises a source of photons.

15. A semiconductor device fabricated from a semiconductor substrate, via a process comprising:
    forming a mask on a top surface of the semiconductor substrate, wherein the mask includes a boss and a cylindrical protrusion that extends beyond an upper portion of the boss;
    shaping a structure of the semiconductor device by transferring a contour of the boss to the semiconductor substrate, via a removal of the boss, a portion of the cylindrical protrusion, and portions of the semiconductor substrate that are uncovered by the removal of the boss, such that a shape of the structure of the semiconductor device is substantially similar to a shape of the boss; and
    exposing an upper layer of the structure of the semiconductor device by a removal of a remaining portion of the cylindrical protrusion.

16. The semiconductor device of claim 15, wherein the shape of the structure of the semiconductor device is substantially similar to a truncated paraboloid.

17. The semiconductor device of claim 15, wherein the process further comprises:
    using a nano-indendation or a nano-imprint process to form the mask on the top surface of the semiconductor substrate.

18. The semiconductor device of claim 15, wherein a variance in an amount of time associated with the shaping of the structure of the semiconductor device is based on a height of the cylindrical protrusion.

19. The semiconductor device of claim 15, wherein the process further comprises:
    affixing an electrical contact to the upper layer of the structure of the semiconductor device.

20. The semiconductor device of claim 15, wherein the semiconductor component is a light-emitting diode (LED) included in a display device of a head-mounted device comprising a virtual-reality device, an augmented-reality device, or a mixed-reality device.

* * * * *